(12) United States Patent
Zheng et al.

(10) Patent No.: US 11,922,574 B2
(45) Date of Patent: Mar. 5, 2024

(54) METHOD AND DEVICE FOR DETERMINING PLURALITY OF LAYERS OF BOUNDING BOXES, COLLISION DETECTION METHOD AND DEVICE, AND MOTION CONTROL METHOD AND DEVICE

(71) Applicant: Tencent Technology (Shenzhen) Company Limited, Guangdong (CN)

(72) Inventors: Yu Zheng, Guangdong (CN); Zhengyou Zhang, Guangdong (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 322 days.

(21) Appl. No.: 17/388,841

(22) Filed: Jul. 29, 2021

(65) Prior Publication Data
US 2021/0358209 A1 Nov. 18, 2021

Related U.S. Application Data

(63) Continuation of application No. PCT/CN2020/095241, filed on Jun. 10, 2020.

(30) Foreign Application Priority Data

Jun. 17, 2019 (CN) .......................... 201910523727.0

(51) Int. Cl.
*G06T 17/10* (2006.01)
*G06T 7/11* (2017.01)

(52) U.S. Cl.
CPC ................ *G06T 17/10* (2013.01); *G06T 7/11* (2017.01); *G06T 2210/12* (2013.01); *G06T 2210/21* (2013.01); *G06T 2210/22* (2013.01)

(58) Field of Classification Search
None
See application file for complete search history.

(56) References Cited

U.S. PATENT DOCUMENTS

| 2002/0154128 | A1 | 10/2002 | Zachmann | |
|---|---|---|---|---|
| 2003/0164864 | A1* | 9/2003 | Aharon | G06T 17/00 345/474 |

(Continued)

FOREIGN PATENT DOCUMENTS

| CN | 102496140 A | 6/2012 |
|---|---|---|
| CN | 102663825 A | 9/2012 |

(Continued)

OTHER PUBLICATIONS

Supplementary European Search Report dated Aug. 5, 2022 in Application No. 20827866.3, p. 1-19.

(Continued)

*Primary Examiner* — Jeffrey J Chow
(74) *Attorney, Agent, or Firm* — ARENTFOX SCHIFF LLP

(57) ABSTRACT

A method for determining a plurality of layers of bounding boxes of an object includes determining a polyhedron capable of accommodating the object therein as a first-layer bounding box. The method also includes selecting one vertex from a plurality of vertices of the first-layer bounding box as a target vertex, and determining, by processing circuitry of a computing device, a support plane of the object. The support plane has a normal vector that has a specific direction corresponding to the target vertex and that is closest to the target vertex, the support plane being a plane passing through a point on a surface of the object such that the object is completely located on one side of the support plane. The method further includes cutting the first-layer (Continued)

bounding box based on at least the support plane to form a smaller bounding box, as a second-layer bounding box.

20 Claims, 9 Drawing Sheets

(56) References Cited

U.S. PATENT DOCUMENTS

| | | | |
|---|---|---|---|
| 2008/0094391 A1* | 4/2008 | Yanagihara | A63F 13/92 345/419 |
| 2020/0175726 A1* | 6/2020 | Kuma | H04N 19/119 |
| 2021/0217202 A1* | 7/2021 | Zakharchenko | H04N 19/597 |

FOREIGN PATENT DOCUMENTS

| | | |
|---|---|---|
| CN | 105205867 A | 12/2015 |
| CN | 105469406 A | 4/2016 |
| CN | 107803831 A | 3/2018 |
| CN | 108052703 A | 5/2018 |
| CN | 108648548 A | 10/2018 |
| CN | 110232741 A | 9/2019 |

OTHER PUBLICATIONS

Figueiredo Mauro et al: "A Survey on Collision Detection Techniques for Virtual Environments", Milage Project Project for BIM based Energy Efficient Building Design, Jan. 2002, pp. 1-24.

Klosowski J T et al: "Efficient collision detection using bounding volume hierarchies of k-DOPs", IEEE Transactions on Visualization and Computer Graphics, IEEE, USA, vol. 4, No. 1, Jan. 1998, pp. 21-36.

Krishnan Set al: "Rapid and Accurate Contact Determination between Spline Models using ShellTrees", Computer Graphics Forum : Journal of the European Association for Computer Graphics, Wiley-Blackwell, Oxford, vol. 17, No. 3, Dec. 25, 2001, pp. 315-326.

International Search Report dated Sep. 16, 2020 in International Application No. PCT/CN2020/095241 with English translation, 12 pgs.

Ming C. Lin, et al., A Fast Algorithm for Incremental Distance Calculation, 7 pgs.

Elmer G. Gilbert, et al., A Fast Procedure for Computing the Distance Between Complex Objects in Three-Dimensional Space, IEEE Journal of Robotics and Automation, vol. 4, No. 2. Apr. 1988, 11 pgs.

Gabriel Zachmann, The Box Tree: Exact and Fast Collision Detection of Arbitrary Polyhedra, Fraunhofer Institute for Computer Graphics, 10 pgs.

Elmer G. Gilbert, et al., Computing the Distance Between General Convex Objects in Three-Dimensional Space, IEEE Transactions on Robotics and Automation, vol. 6, No. 1, Feb. 1990, 9 pgs.

S. Gottschalk, et al., OBBTree: A Hierarchical Structure for Rapid Interference Detection, http://www.cs.unc.edu/"geom/OBB/OBBT. html, 10 pgs.

* cited by examiner

METHOD AND DEVICE FOR DETERMINING PLURALITY OF LAYERS OF BOUNDING BOXES, COLLISION DETECTION METHOD AND DEVICE, AND MOTION CONTROL METHOD AND DEVICE

RELATED APPLICATIONS

This application is a continuation of International Application No. PCT/CN2020/095241, filed on Jun. 10, 2020, which claims priority to Chinese Patent Application No. 201910523727.0, filed on Jun. 17, 2019, and entitled "METHOD AND DEVICE FOR DETERMINING PLURALITY OF LAYERS OF BOUNDING BOXES, COLLISION DETECTION METHOD AND DEVICE, AND MOTION CONTROL METHOD AND DEVICE." The entire disclosures of the prior applications are hereby incorporated by reference in their entirety.

FIELD OF THE TECHNOLOGY

The present disclosure relates to the field of information processing for three-dimensional objects, including a method for determining a plurality of layers of bounding boxes of an object, a method for performing object collision detection based on a plurality of layers of bounding boxes of an object, a motion control method based on the collision detection method, a device for applying the foregoing methods, and a computer readable recording medium.

BACKGROUND OF THE DISCLOSURE

In information processing of a three-dimensional object, for example, in a collision detection process for an object, an object with a complex shape and a continuous curved surface is often encountered. However, general collision detection methods are usually limited to specific types of objects and are not applicable to objects with complex shapes and continuous curved surfaces.

For example, in collision detection, the related Gilbert-Johnson-Keerth (GJK) distance algorithm can only be applied to a simple convex geometry, and the Lin-Canny (LC) algorithm can only be applied to objects described by using polyhedrons and triangular grids.

Therefore, it is desirable to provide a feasible collision detection method for objects with complex shapes and continuous curved surfaces.

SUMMARY

Embodiments of the present disclosure provide a method, a device, and a medium for determining a plurality of layers of bounding boxes of an object, so that an irregular three-dimensional object can be approximated as a relatively regular object, such as a convex geometry. In addition, on this basis, an object collision detection method and device and a motion control method and device based on a plurality of layers of bounding boxes of an object, and a medium are further provided.

In an embodiment, a method for determining a plurality of layers of bounding boxes of an object includes determining a polyhedron capable of accommodating the object therein as a first-layer bounding box. The method also includes selecting one vertex from a plurality of vertices of the first-layer bounding box as a target vertex, and determining, by processing circuitry of a computing device, a support plane of the object. The support plane has a normal vector that has a specific direction corresponding to the target vertex and that is closest to the target vertex, the support plane being a plane passing through a point on a surface of the object such that the object is completely located on one side of the support plane. The method further includes cutting the first-layer bounding box based on at least the support plane to form a smaller bounding box, as a second-layer bounding box.

In an embodiment, an object collision detection method includes determining, for at least a first object, a plurality of layers of bounding boxes, each layer of the plurality of layers being capable of accommodating the first object therein. The method also includes performing collision detection between at least one of the plurality of layers of bounding boxes of the first object and a second object, to obtain a collision detection result based on the plurality of layers of bounding boxes. The method further includes determining, by processing circuitry of a computing device, a collision detection result between the first object and the second object according to the collision detection result based on the plurality of layers of bounding boxes. The determining, for at least the first object, the plurality of layers of bounding boxes capable of accommodating the first object therein includes determining a polyhedron capable of accommodating the first object therein as a first-layer bounding box. The determining the plurality of layers of bounding boxes capable of accommodating the first object also includes selecting one vertex from a plurality of vertices of the first-layer bounding box as a target vertex, and determining a support plane of the first object, the support plane having a normal vector that has a specific direction corresponding to the target vertex, the support plane being a plane passing through a point on a surface of the first object such that the first object to be completely located on one side of the support plane. The determining the plurality of layers of bounding boxes capable of accommodating the first object further includes cutting the first-layer bounding box based on at least the support plane to form a smaller bounding box, as a second-layer bounding box.

In an embodiment, a device for determining a plurality of layers of bounding boxes of an object includes processing circuitry configured to determine a polyhedron capable of accommodating the object therein as a first-layer bounding box, and select one vertex from a plurality of vertices of the first-layer bounding box as a target vertex. The processing circuitry is also configured to determine a support plane of the object, the support plane having a normal vector that has a specific direction corresponding to the target vertex and that is closest to the target vertex, the support plane being a plane passing through a point on a surface of the object such that the object is completely located on one side of the support plane, and cut the first-layer bounding box based on at least the support plane to form a smaller bounding box, as a second-layer bounding box.

In the method for determining a plurality of layers of bounding boxes of an object according to the embodiments of the present disclosure, a plurality of layers of bounding boxes gradually become smaller layer by layer and that accommodate the object therein are constructed layer by layer in an outer-to-inner order. Herein, the bounding box is no longer limited to a geometry with a simple shape, but is a complex geometry having a higher degree of fitting with the object. By approximating to an object with a complex shape and a continuous curved surface by using a bounding box, a problem that a related subsequent processing method cannot be applied due to the complex shape of the object can be solved, thereby helping to extend a related algorithm to the object with a complex continuous curved surface. In addition, by constructing a plurality of layers of bounding boxes, different requirements of subsequent processing can be met. In addition, according to the object collision detection method in the embodiments of the present disclosure, collision detection is performed layer by layer based on a plurality of layers of bounding boxes, and a good tradeoff can be reached between collision detection efficiency and accuracy.

DESCRIPTION OF EMBODIMENTS

Figure 1:
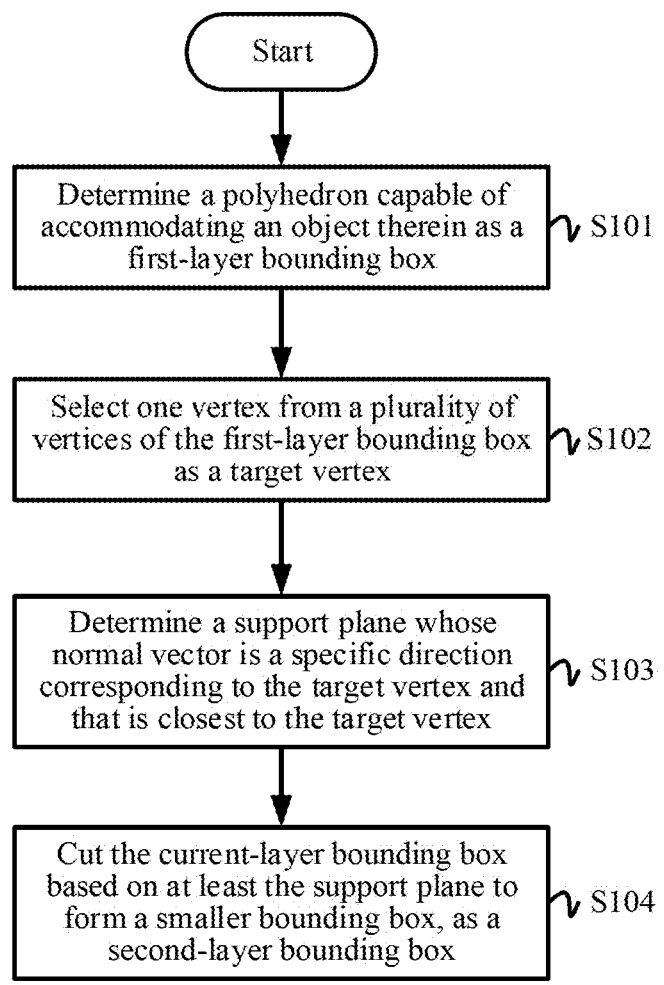
FIG. 1 is a flowchart of a method for determining a plurality of layers of bounding boxes of an object according to an embodiment of the present disclosure.

The implementations of the present disclosure are described below with reference to the accompanying drawings. The following description, with reference to the accompanying drawings, is provided to help understanding of exemplary implementations of the present disclosure defined by the claims and equivalents thereof. The description includes specific details for helping understanding, but the specific details are only exemplary. Therefore, a person skilled in the art knows that, various changes and modifications may be made to the implementations described herein without departing from the scope and spirit of the present disclosure. In addition, to make this specification clearer and more concise, detailed descriptions of functions and constructions well known in the art are omitted.

In consideration that collision detection processing can be performed only on a specific type of object in the related art, for an object with a complex shape and a continuous curved surface, predetermined processing may be considered, so that the object can be approximately considered as a specific type of object, and subsequent processing, such as collision detection processing, can be performed by using a common method in the art.

First, a basic concept of determining a plurality of layers of bounding boxes of an object is briefly described in the embodiments of the present disclosure. In general, the object described herein is an irregular three-dimensional object, such as an object with a complex shape and a continuous curved surface. Given the irregularity of the object, it is considered to approximate the object by determining a plurality of layers of bounding boxes of the object, to approximately convert the irregular object into a regular object, thereby facilitating subsequent processing.

Specifically, in the method for determining a plurality of layers of bounding boxes of an object according to the embodiments of the present disclosure, a first-layer bounding box capable of accommodating the object therein is initially selected. Then, among all vertices of the outermost-layer bounding box, a vertex farthest from a surface of the object is selected as a target vertex, and a support plane corresponding to the target vertex is determined. The support plane segments the current outermost-layer bounding box to form a second-layer bounding box smaller than the first-layer bounding box. The foregoing processing is then repeated for the newly formed second-layer bounding box to form a third-layer bounding box, a fourth-layer bounding box, etc., until a predetermined condition is met, and the processing ends. Therefore, through such cyclic processing, a plurality of layers of bounding boxes that wrap the object are formed for the object. The outermost-layer bounding box is the simplest in geometry, but has the lowest degree of fitting with the object. The innermost-layer bounding box is most complex in geometry, but has the highest degree of fitting with the object.

In an embodiment of subsequent processing, collision detection may be performed layer by layer based on a plurality of layers of bounding boxes for an object whose plurality of layers of bounding boxes has been pre-determined. Specifically, first, collision detection is performed on an outer-layer bounding box. If it is determined that a collision occurs on the outer-layer bounding box, collision detection is further performed on an inner-layer bounding box.

In the following, first, a method for determining a plurality of layers of bounding boxes of an object according to an embodiment of the present disclosure is described with reference to FIG. 1 by using two layers of bounding boxes as an example. As shown in FIG. 1, the method includes the following steps.

First, in step S101, a polyhedron capable of accommodating the object therein is determined as a first-layer bounding box.

For example, the first-layer bounding box may be determined in any selected manner, as long as the object can be accommodated therein, regardless of a size of the first-layer bounding box and a degree of fitting with the object.

Alternatively, in another implementation, determining a polyhedron capable of accommodating the object therein as a first-layer bounding box may further include the following steps.

First, a group of direction vectors is selected. The group of direction vectors includes at least four direction vectors. For example, the group of direction vectors may be normal vectors of fouTfaces of a space regular tetrahedron. In this case, the formed first-layer bounding box will also be a regular tetrahedron. In another example, the group of direction vectors may include six direction vectors in positive and negative directions along three coordinate axes (x, y, z). Herein, in the solution of this embodiment of the present disclosure, a coordinate system may be disposed randomly, a location of a coordinate origin is disposed randomly, and directions of the three coordinate axes x, y, and z are disposed randomly. When the group of direction vectors includes six direction vectors in the positive and negative directions along the three coordinate axes (x, y, z), the formed first-layer bounding box will be a cuboid aligned with the coordinate axes.

Then, a plurality of support planes of the object that use each direction vector as a normal vector are respectively determined. In addition, use a polyhedron formed by the plurality of support planes as the first-layer bounding box.

Next, with reference to the flowchart in FIG. 1, after the initial first-layer bounding box is determined, the processing proceeds to step S102. In step S102, one vertex from a plurality of vertices of the first-layer bounding box is selected as a target vertex.

For example, any one of the plurality of vertices of the first-layer bounding box may be selected as the target vertex.

Alternatively, in another implementation, a specific one of the plurality of vertices of the first-layer bounding box may be selected as the target vertex. Specifically, one vertex of the plurality of vertices of the first-layer bounding box may be selected as the target vertex through the following processing: First, determining a shortest distance from each vertex of the first-layer bounding box to a surface of the object. Then, the largest one of all the shortest distances is selected as a first distance. Finally, a vertex corresponding to the first distance is used as the target vertex. That is, one vertex farthest from the surface of the object is selected from the plurality of vertices of the first-layer bounding box as the target vertex. Through such selection, the processing described below for cutting the first-layer bounding box by using the support plane can cut off as many portions as possible of the first-layer bounding box, so that the newly formed second-layer bounding box can more closely fit the object, and the innermost-layer bounding box can be converged at the fastest speed.

For example, in an implementation, for each vertex, distances from the vertex to all points on the surface of the object can be calculated, and the shortest distance among these distances can be determined.

In another example, in another implementation, for each vertex, a distance from the vertex to a corresponding support plane may also be calculated as the shortest distance from the vertex to the surface of the object.

Specifically, the determining a shortest distance from each vertex of the first-layer bounding box to the surface of the object further includes: respectively performing the following processing for each vertex of the first-layer bounding box:

First, a specific direction corresponding to a vertex of the first-layer bounding box is determined. The specific direction corresponding to the vertex described herein may be randomly selected, or may be a direction along an average value of outward normal vectors of all planes that include the vertex and that are in the first-layer bounding box. In the first-layer bounding box, an outward normal vector of a plane refers to a direction perpendicular to the plane and pointing away from the first-layer bounding box.

Then, a support plane whose normal vector is the specific direction corresponding to the vertex and that is closest to the vertex is determined. For example, there may be only one support plane that can pass through a point on the surface of the object and that causes the object to be located on one side thereof, or there may be a plurality of (for example, two) support planes that can pass through a point on the surface of the object and that cause the object to be located on one side thereof. Thus, in the latter case, a support plane closest to the vertex is selected from the plurality of support planes.

Finally, a distance from the vertex to the support plane is calculated as a shortest distance from the vertex to the surface of the object. Details of determining the support plane are described later.

Next, still referring to FIG. 1, after the target vertex is selected, the processing proceeds to step S103. In step S103, a support plane whose normal vector is a specific direction corresponding to the target vertex and that is closest to the target vertex is selected. For example, there may be only one support plane that can pass through a point on the surface of the object and that causes the object to be located on one side thereof, or there may be a plurality of (for example, two) support planes that can pass through a point on the surface of the object and that cause the object to be located on one side thereof. Thus, in the latter case, a support plane closest to the vertex is selected from the plurality of support planes.

The foregoing describes a case in which a support plane corresponding to each vertex is determined, and a distance from each vertex to a corresponding support plane is used as the shortest distance from the vertex to the surface of the object. In this case, in step S103, the support plane of the target vertex obtained in step S102 may be directly used without being re-determined. Certainly, if the shortest distance from each vertex to the surface of the object is determined by using another method, in step S103, a support plane corresponding to the target vertex needs to be re-determined. Details of determining the support plane is described later.

Finally, in step S104, the current-layer bounding box is cut based on at least the support plane to form a smaller bounding box, as a second-layer bounding box. In this embodiment, the current-layer bounding box is the first-layer bounding box.

In addition, as described above with reference to FIG. 1, in step S102, one vertex is selected from the plurality of vertices of the first-layer bounding box as the target vertex. In step S103, the support plane corresponding to the target vertex is determined. In addition, in step S104, the determined support plane is used for cutting the first-layer bounding box to obtain the second-layer bounding box. However, this embodiment of the present disclosure is not limited thereto. For example, in step S102, a plurality of (for example, two) vertices may be selected from the plurality of vertices of the first-layer bounding box as target vertices. For example, two vertices corresponding to the largest one and the secondary largest one of all shortest distances may be selected as the target vertices. Then, two support planes corresponding to the two target vertices are used for cutting the first-layer bounding box to form the second-layer bounding box.

With reference to FIG. 1, a process of single-time processing when two layers of bounding boxes of an object are established is described above. Next, a detailed procedure of iteration processing is described with reference to FIG. 2 when a plurality of layers of bounding boxes of an object are established according to another embodiment of the present disclosure. In fact, iteration processing for establishing a plurality of layers of bounding boxes of an object is repeatedly performing single-time processing for establishing two layers of bounding boxes in FIG. 1.

Figure 2:
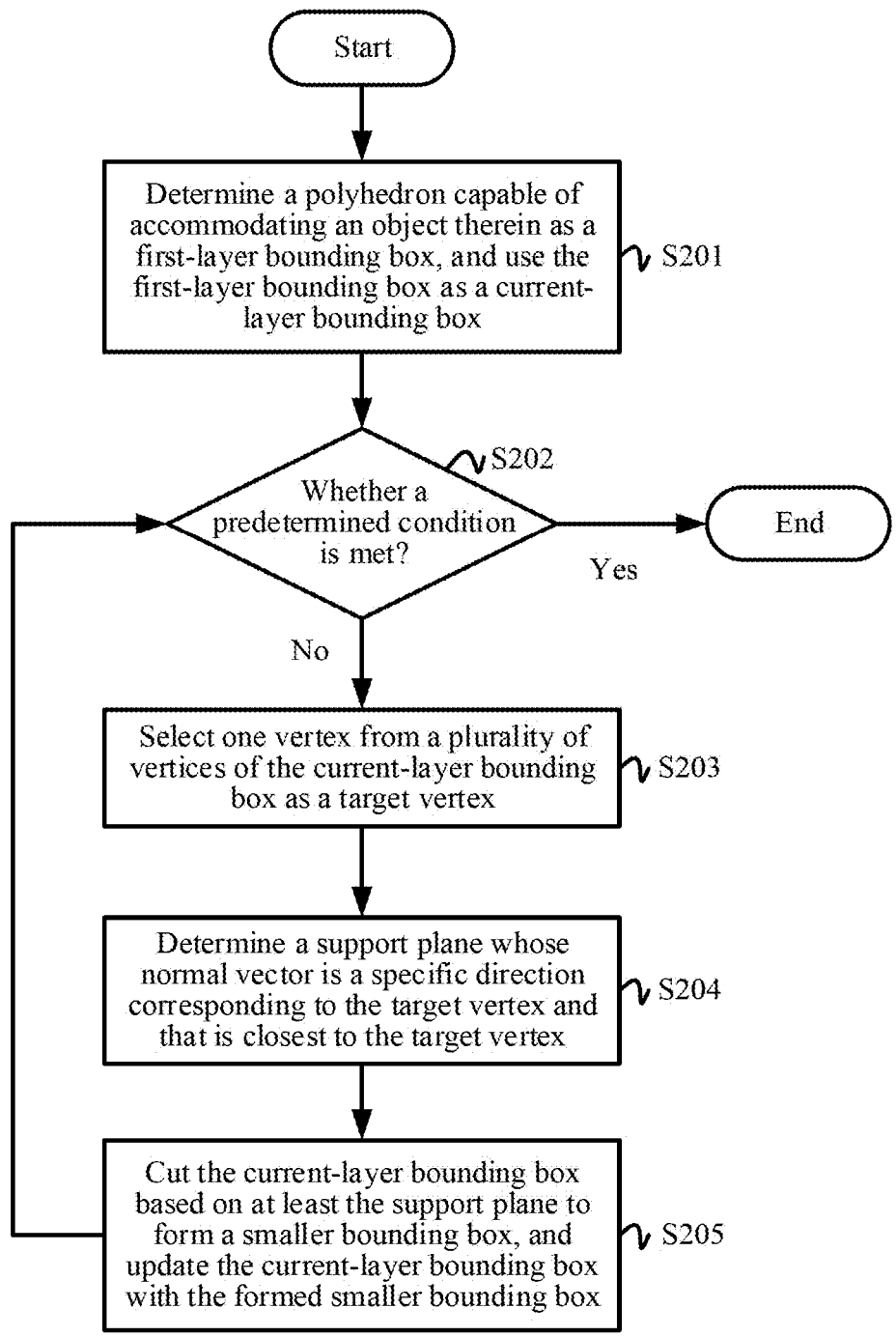
FIG. 2 is a flowchart of a method for determining a plurality of layers of bounding boxes of an object according to another embodiment of the present disclosure.

As shown in FIG. 2, the method includes the following steps.

First, in step S201, a polyhedron capable of accommodating the object therein is determined as a first-layer bounding box, and the first-layer bounding box is used as a current-layer bounding box.

Then, in step S202, it is determined whether a predetermined condition is met. In an implementation, the predetermined condition may be that a quantity of iterations (repetition times) processed has reached a first predetermined threshold (for example, 10). The first predetermined threshold may be manually set or selected based on an empirical value. Alternatively, in another implementation, the predetermined condition may be that the first distance is less than a second predetermined threshold. The second predetermined threshold may be manually set or selected based on an empirical value. Certainly, the second predetermined threshold and the first predetermined threshold are respectively different values. If the largest one of all the shortest distances, that is, the first distance is less than the second predetermined threshold, it means that in the current-layer bounding box, all vertices are very close to the surface of the object, that is, a degree of fitting between the current-layer bounding box and the object is sufficiently high. In this case, iteration processing for establishing a plurality of layers of bounding boxes may be ended.

If it is determined in step S202 that the predetermined condition is not met, the processing proceeds to step S203. In step S203, one vertex is selected from a plurality of vertices of the current-layer bounding box as a target vertex.

Similar to the foregoing description with reference to FIG. 1, any one of the plurality of vertices of the current-layer bounding box may be selected as the target vertex. Alternatively, in another implementation, a specific one of the plurality of vertices of the current-layer bounding box may be selected as the target vertex. For example, one vertex farthest from the surface of the object is selected from the plurality of vertices of the current-layer surrounding box as the target vertex.

Then, in step S204, a support plane whose normal vector is a specific direction corresponding to the target vertex and that is closest to the target vertex is determined.

In addition, in step S205, a smaller bounding box is formed by cutting the current-layer bounding box by using at least the support plane, and the current-layer bounding box is updated with the formed smaller bounding box. If a current layer number of the bounding box is represented by n, a layer number of the formed smaller bounding box is (n+1), and the current-layer bounding box is updated with the $(n+1)^{th}$-layer bounding box. So far, one time of iteration processing is completed. The process then returns to step S202 to start the next time of iteration processing.

Similar to the foregoing description with reference to FIG. 1, in step S203, a plurality of (for example, two) vertices may be selected from the plurality of vertices of the current-layer bounding box as target vertices. For example, two vertices corresponding to the largest one and the secondary largest one of all shortest distances may be selected as the target vertices. Then, two support planes corresponding to the two target vertices are used for cutting the current-layer bounding box to form the smaller bounding box.

In addition, if it is determined in step S202 that the predetermined condition is met, the processing ends.

The iteration processing described with reference to FIG. 2 for determining a plurality of layers of bounding boxes of an object is equivalent to repeatedly performing the processing described above with reference to FIG. 1 for establishing two layers of bounding boxes in response to a determination that the predetermined condition (that is, an iteration end condition) is not met. Each iteration generates at least one new support plane, to further form a smaller bounding box. All layers of bounding boxes are nested layer by layer to form a plurality of layers of bounding boxes of the object.

FIG. 3A to FIG. 3D respectively illustrate examples of a first-layer bounding box to a fourth-layer bounding box of an object. In FIG. 3A to FIG. 3D, S represents a surface of the object, and O represents a coordinate origin. As described in the following, in the solution of this embodiment of the present disclosure, the coordinate origin may be set randomly.

Figure 3A:
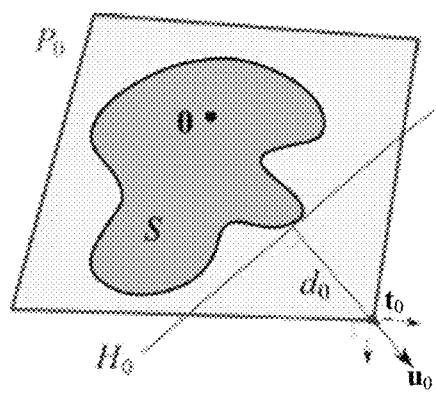
FIG. 3A to FIG. 3D respectively illustrate examples of a first-layer bounding box to a fourth-layer bounding box of an object.

In FIG. 3A, $P_0$ represents the first-layer bounding box, $t_0$ represents a target vertex selected from the first-layer bounding box, $d_0$ represents the shortest distance from the target vertex $t_0$ to the object, $u_0$ represents a specific direction corresponding to the target vertex $t_0$, and $H_0$ represents a support plane corresponding to the target vertex $t_0$.

Figure 3B:
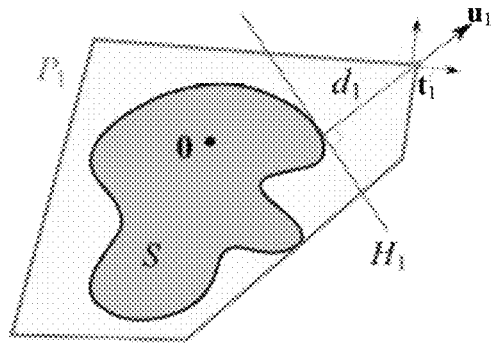

By cutting the first-layer bounding box $P_0$ by using the support plane $H_0$, the second-layer bounding box in FIG. 3B can be obtained. Similarly, in FIG. 3B, $P_1$ represents the second-layer bounding box, $t_1$ represents a target vertex selected from the second-layer bounding box, $d_1$ represents the shortest distance from the target vertex $t_1$ to the object, $u_1$ represents a specific direction corresponding to the target vertex $t_1$, and $H_1$ represents a support plane corresponding to the target vertex $t_1$.

Figure 3C:
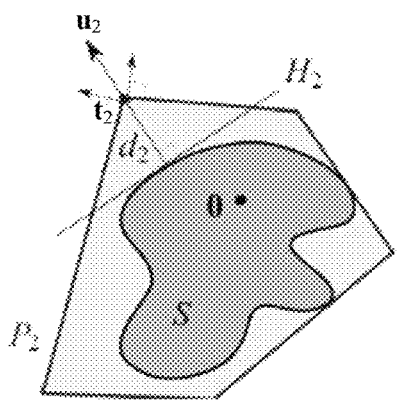

By cutting the second-layer bounding box $P_1$ by using the support plane $H_1$, the third-layer bounding box in FIG. 3C can be obtained. Similarly, in FIG. 3C, $P_2$ represents the third-layer bounding box, $t_2$ represents a target vertex selected from the third-layer bounding box, $d_2$ represents the shortest distance from the target vertex $t_2$ to the object, $u_2$ represents a specific direction corresponding to the target vertex $t_2$, and $H_2$ represents a support plane corresponding to the target vertex $t_2$.

Figure 3D:
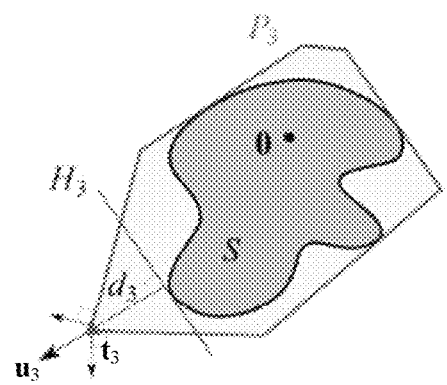

By cutting the third-layer bounding box $P_2$ by using the support plane $H_2$, the fourth-layer bounding box in FIG. 3D can be obtained. Similarly, in FIG. 3D, $P_3$ represents the fourth-layer bounding box, $t_3$ represents a target vertex selected from the fourth-layer bounding box, $d_3$ represents the shortest distance from the target vertex $t_3$ to the object, $u_3$ represents a specific direction corresponding to the target vertex $t_3$, and $H_3$ represents a support plane corresponding to the target vertex $t_3$.

Next, a specific process of determining the support plane is described in detail with reference to FIG. 4. Determining a support plane of a target vertex is used as an example for description. However, in the case of determining the support plane to calculate the shortest distance from the vertex to the surface of the object as described above, a support plane of each vertex also needs to be determined. When a vertex is given, a processing procedure of determining a support plane corresponding to the vertex is completely the same, regardless of whether the vertex is the target vertex or any other vertex.

Figure 4:
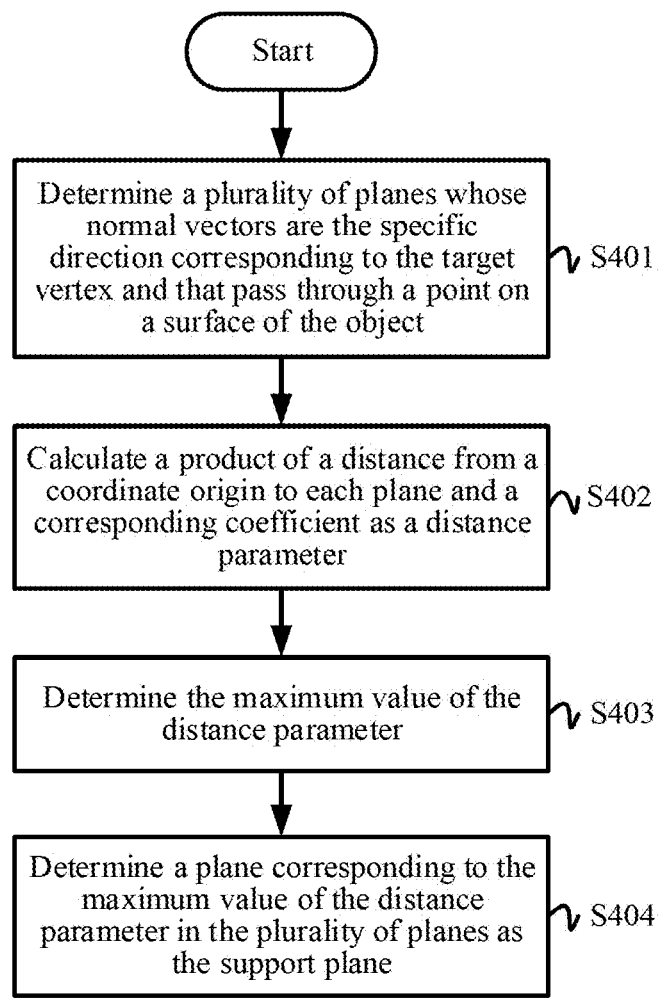
FIG. 4 is a flowchart of a method for determining a support plane according to an embodiment of the present disclosure.

As shown in FIG. 4, the determining a support plane whose normal vector is a specific direction corresponding to the target vertex and that is closest to the target vertex may further include the following steps.

First, in step S401, a plurality of planes are determined whose normal vectors are the specific direction corresponding to the target vertex and that pass through a point on the surface of the object. Because the normal vectors are the same, the plurality of planes are a group of planes parallel to each other. Certainly, points on the surface of the object through which different planes pass are different.

Then, in step S402, calculate a product of a distance from a coordinate origin to each plane and a corresponding coefficient as a distance parameter. When a direction of a vertical line from the coordinate origin to the plane is the same as the specific direction, the corresponding coefficient is a positive value; otherwise, the corresponding coefficient is a negative value. Because a distance is generally a positive value without a symbol, a function of the corresponding coefficient is to enable the distance parameter to carry a symbol that reflects whether the direction of the vertical line from the coordinate origin to the plane is consistent with the specific direction. Thus, for example, the corresponding coefficient may be +1 or −1. Certainly, this embodiment of the present disclosure is not limited thereto. The corresponding coefficient may also be one of any two opposite numbers whose absolute values are the same, for example, +0.5 or −0.5.

In addition, in step S403, the maximum value of the distance parameter is determined. Because the distance parameter is a value with a positive symbol or a negative symbol, when a plurality of distance parameters are all positive values, the maximum value of the distance parameters corresponds to the maximum distance from the coordinate origin to the plane; when the plurality of distance parameters are all negative values, the maximum value of the distance parameters corresponds to the minimum distance from the coordinate origin to the plane; alternatively, when the plurality of distance parameters have both positive and negative values, the maximum value of the distance parameters corresponds to the maximum positive distance parameter.

In addition, as described above, the coordinate origin may be randomly set. In addition, in an implementation, the specific direction corresponding to the target vertex is an average direction of outward normal vectors of all planes including the target vertex in a current-layer bounding box. That is, the specific direction corresponding to the target vertex is a direction away from the object. Therefore, if the coordinate origin and the target vertex are respectively located on two sides of a plane, a direction of a vertical line from the coordinate origin to the plane is the same as the specific direction; otherwise, if the coordinate origin and the target vertex are on the same side of a plane, a direction of a vertical line from the coordinate origin to the plane is opposite to the specific direction.

In an implementation, the coordinate origin may alternatively be set on the target vertex. In this case, because the coordinate origin and the target vertex are located on the same sides of a plurality of planes, all distance parameters are negative values. Therefore, the processing in step S402 is equivalent to determining the minimum value of distances from the target vertex to the plurality of planes.

Next, a specific process of determining the maximum value of a distance parameter according to an embodiment of the present disclosure is described with reference to FIG. 5.

Before a specific process of determining the maximum value of the distance parameter is described, a function of a surface of an object is first defined as follows. It is assumed that the surface S of the object is described by function f: $R^2 \rightarrow R^3$, where $R^2$ represents that function f has two independent variables, and $R^3$ represents that function f has three dependent variables. Any point s on the surface of the object may be determined by using function f(a), that is, s=f(a), where independent variable a∈A, and A represents an entire value domain. Herein, for a three-dimensional object, any point s on the surface of the object actually includes three coordinate values: x, y, and z. Herein, three coordinate values x, y, and z are coordinate values in the coordinate system randomly established as described above. In addition, independent variable a herein includes two change parameters, and it is assumed that the two change parameters are respectively represented by α and β. Then, as an example, the object may be represented by the following parameter equation (1):

$$\begin{cases} x = a + R\cos\alpha \\ y = b + R\sin\alpha\cos\beta \\ z = c + R\sin\alpha\sin\beta \end{cases} \quad (1)$$

where a, b, c, and R are constants, α and β are independent variables, and x, y, and z are dependent variables. In fact, any three-dimensional object may be represented by using different parameter equations.

In addition, a support function of the surface of the object in specific direction u is defined as:

$$h_s(u) = \max_{s \in S} u^T s = \max_{a \in A} u^T f(a) \quad (2)$$

where $u^T$ represents a normal vector of u, and $u^T s$ represents a distance parameter from the coordinate origin to a plane whose normal vector is n and that passes through point s. As described above, when a direction of a vertical line from the coordinate origin to the plane passing through point s is the same as the direction of u, $u^T s$ is a positive value; otherwise, $u^T s$ is a negative value. That is, the support function is a function that maximizes the distance parameter. A plane that enables the distance parameter to have the maximum value is a support plane.

For an object with a complex continuous curved surface, calculation of the support function is a nonlinear optimization issue. In the related art, there is no effective calculation method to ensure that a global optimal solution can be obtained. According to the method in the related art, an obtained solution of the support function can only achieve local optimization, but cannot ensure global optimization. For example, a support plane corresponding to a local optimal solution of the support function may limit an object to one side of the support plane in a small area of the object. However, for the entire area of the object, the object cannot be completely limited to one side of the support plane.

In this embodiment of the present disclosure, the global optimal solution is obtained in a manner of segmenting a value domain of the object.

Figure 5:
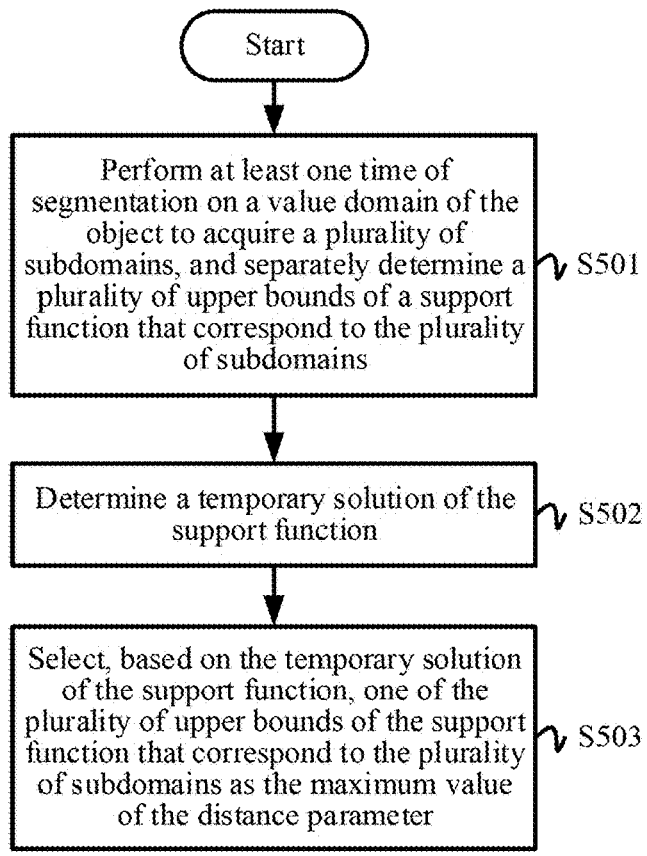
FIG. 5 is a flowchart of a method for determining the maximum value of a distance parameter according to an embodiment of the present disclosure.

As shown in FIG. 5, the determining the maximum value of the distance parameter further includes the following steps.

First, in step S501, at least one time (one iteration) of segmentation is performed on the value domain of the object to obtain a plurality of subdomains, and a plurality of upper bounds of the support function are respectively determined that correspond to the plurality of subdomains. The upper bound refers to the theoretical maximum value of the support function. However, the maximum value is usually reached under very special conditions. The upper bound corresponding to each subdomain may be different. The support function is a function that maximizes the distance parameter, and the upper bound of the support function decreases with segmentation of the value domain. For example, if the value domain is segmented into two subdomains for the first time, upper bounds corresponding to the two subdomains are less than or equal to an upper bound corresponding to the entire value domain. If one of the two subdomains is segmented into two smaller subdomains again for the second time, upper bounds corresponding to the two smaller subdomains are less than or equal to the upper bound of the subdomain before segmenting.

Then, in step S502, a temporary solution of the support function is determined. Herein, the temporary solution of the support function is predetermined. For example, the temporary solution of the support function may be obtained by using a random sampling point, or may be obtained by using any local optimization algorithm (for example, a gradient descent method). In addition, as processing is performed, the temporary solution of the support function may also be updated through the following processing: solving, in response to a determination that an upper bound of the support function in a subdomain is greater than the temporary solution of the support function and a size of the subdomain is less than a first predetermined threshold, the support function in the subdomain. That is, when a subdomain has been segmented to be small enough (for example, an extreme case in which only one point is included), a value of the support function may be obtained by randomly sampling a point in the subdomain. If the solved value of the support function is greater than the temporary solution of the support function, that is, if the solved value of the support function is better than the temporary solution of the support function, the temporary solution of the support function is updated with the solved value of the support function; otherwise, the temporary solution of the support function is not to be updated.

Finally, in step S503, one of the plurality of upper bounds of the support function is selected, based on the temporary solution of the support function, as the maximum value of the distance parameter.

More specifically, the foregoing selection may be performed in the following manner: selecting, from the plurality of upper bounds, an upper bound whose difference from the temporary solution of the support function is greater than 0 and less than a second predetermined threshold as the maximum value of the distance parameter. First, the upper bound of the support function needs to be greater than the temporary solution of the support function, that is, the difference between the upper bound of the support function and the temporary solution of the support function is greater than 0. That is, if an upper bound corresponding to a subdomain is less than the temporary solution of the support function, it means that all solutions of the support function in the subdomain are inferior to the temporary solution of the support function and are to be discarded. In addition, as described above, the upper bound of the support function gradually decreases as the subdomain is gradually segmented. When the upper bound of the support function is reduced to be sufficiently close to the temporary solution of the support function, the upper bound may be used as the final solution of the support function.

Next, a specific process is described to further illustrate how to determine the maximum value of the distance parameter.

First, let $\hat{A}$ be a value domain of an object, and an initial value of $\hat{A}$ be an entire value domain A, that is, $\hat{A}=A$. $\hat{A}$ is segmented into a plurality of subdomains $A_j$, and the following operation is performed on each subdomain $A_j$.

A plurality of upper bounds $\hat{h}_j$ of the support function that correspond to the plurality of subdomains are calculated. In an implementation, the following inequality (4) may be obtained when function f used for describing the surface of the object meets Lipschitz continuity, that is, when $\|f(a_1)-f(a_2)\| \leq L\|a_1-a_2\|$ (where L is a Lipschitz constant) is met:

$$|u^T f(a_1) - u^T f(a_2)| \leq \|u\| \cdot \|f(a_1-a_2)\| \leq \|u\| L \|a_1-a_2\| \qquad (4)$$

In addition, because $u^T f(a_1) - u^T f(a_2) \leq |u^T f(a_1) - u^T f(a_2)|$, for any $a_1, a_2 \in A$, the following inequality (5) holds:

$$|u^T f(a_1) \leq u^T f(a_2) + \|u\| L \|a_1-a_2\| \qquad (5)$$

On this basis, the following inequality (6) holds:

$$u_T f(a) \leq u^T f(\bar{a}) + L_j \|a-\bar{a}\| \qquad (6)$$

where $\bar{a}$ is the midpoint of the value domain.

Further, the following inequality (7) may be obtained:

$$h_s(u) = \max_{s \in s} u^T s \leq u^T f(\bar{a}) + L_j \max_{a \in A_j} \|a-\bar{a}\| \qquad (7)$$

Therefore, the upper bound $\hat{h}_j$ is calculated according to the following formula:

$$\hat{h}_j = u^T f(\bar{a}) + L_j \max_{a \in A_j} \|a-\bar{a}\| \qquad (8)$$

where $\bar{a}$ is the midpoint of subdomain $A_j$, and $L_j$ is a Lipschitz constant and may be estimated from $\max_{a \in A_j} \|\partial (u^T f(a))/\partial a\|$.

Certainly, the foregoing enumerated specific methods for calculating the upper bound of the support function are only examples. This embodiment of the present disclosure is not limited thereto. When function f describing the surface of the object meets different conditions (for example, different continuity), different upper bound calculation formulas may also be derived.

If the upper bound of the support function in subdomain $A_j$ is greater than the temporary solution of the support function, and the size of subdomain $A_j$ is greater than a specific threshold, that is, $\hat{h}_j > h^*$ and $|A_j| > \epsilon_A$ ($|A_j|$ represents the size of the value domain, and $\epsilon_A$ is the threshold), $A_j$ is added to a subdomain list.

Let the temporary solution of the support function be $a^*$, $s^* = f(a^*)$, and $h^* = u^T s^* = u^T f(a^*)$. As described above, the temporary solution of the support function is predetermined. For example, the temporary solution of the support function may be obtained by using a random sampling point, or may be obtained by using any local optimization algorithm (for example, a gradient descent method).

In addition, as processing progresses, the temporary solution of the support function may also be updated through the following processing. If the upper bound of the support function in subdomain $A_j$ is greater than the temporary solution of the support function, and the size of subdomain $A_j$ is less than or equal to a specific threshold, that is, $\hat{h}_j > h^*$ and $|A_j| \leq \epsilon_A$ ($|A_j|$ represents the size of the value domain, and $\epsilon_A$ is the threshold), the support function is solved in subdomain $A_j$. For example, as described above, the value of the support function may be solved by randomly sampling a point in the subdomain. If the solved value of the support function is greater than the temporary solution of the support function, that is, if the solved value of the support function is better than the temporary solution of the support function, the temporary solution of the support function is updated with the solved value of the support function; otherwise, the temporary solution of the support function is not to be updated.

In addition, the temporary solution of the support function may be updated in the following manner. Because a term of $u^T f(\bar{a})$ is included in formula (8) described above, $u^T f(\bar{a})$ may be compared with the size of the temporary solution $h^*$ of the support function. If $u^T f(\bar{a}) > h^*$, the temporary solution h* of the support function is updated with $u^T f(\hat{a})$; otherwise, the temporary solution of the support function is not to be updated.

In addition, if the upper bound of the support function in subdomain $A_j$ is less than or equal to the temporary solution of the support function, that is, if the upper bound of the support function in subdomain $A_j$ is inferior to the temporary solution of the support function, the subdomain is not to be added to the subdomain list and is discarded.

After the foregoing operations are completed for each subdomain $A_j$, let $\hat{h}$ be the maximum upper bound of the support function in the subdomain list, let $\hat{A}$ be a subdomain corresponding to the maximum upper bound, and $\hat{A}$ is removed from the subdomain list. So far, the first time of segmentation on the value domain of the object is completed.

Next, it is determined whether the difference between $\hat{h}$ and h* is less than the second predetermined threshold, that is, whether the upper bound of the support function is reduced to be sufficiently close to the temporary solution of the support function. If $\hat{h}-h^* < \epsilon$, the processing ends, and in this case, $\hat{h}$ is used as the final solution of the support function. Otherwise, the processing returns to the segmentation step described above, to perform next segmentation, segment $\hat{A}$ into a plurality of subdomains, and repeat subsequent processing. Herein, when the first time of segmentation is performed, $\hat{A}$ is the entire value domain of the object, and when the second time of segmentation is performed, $\hat{A}$ is a subdomain corresponding to the maximum upper bound selected when the first time of segmentation is performed. By analogy, when an nth time of segmentation is performed, $\hat{A}$ is a subdomain corresponding to the maximum upper bound selected when an $(n-1)^{th}$ time of segmentation is performed. Such cyclic processing will be performed for a plurality of times until the difference between $\hat{h}$ and h* is less than the second predetermined threshold.

Referring back to FIG. 4, after the maximum value of the distance parameter is determined, the processing proceeds to step S404. In step S404, a plane corresponding to the maximum value of the distance parameter in the plurality of planes is determined as the support plane.

The specific process of determining a plurality of layers of bounding boxes of an object is described in detail above. The object herein may be an independent complete object.

Alternatively, the object may be a sub-object obtained by segmenting another object. When an object has a special shape, if a plurality of layers of bounding boxes are determined for the entire object, space that does not belong to the object may be surrounded. In other words, even the innermost-layer bounding box does not fit the object high enough. In this case, the object may be segmented to improve the degree of fitting between the bounding box and the object. For ease of understanding, a shape of a swim ring is used as an example for description. It is assumed that the object is an object in a shape of a swim ring. In this case, a bounding box determined for the entire object includes a hollow part of the swim ring. To avoid this case, it may be considered to segment the object into a plurality of sub-objects, and construct a plurality of layers of bounding boxes for each sub-object. In this way, the plurality of layers of bounding boxes determined for each sub-object effectively avoid including the hollow part of the swim ring.

In this case, for example, the bounding boxes of the entire object and the sub-objects may be managed in a form of a bounding box tree. Specifically, by using the foregoing processing, a plurality of layers of bounding boxes of each sub-object are determined, and one or more layers of common bounding boxes are determined for the plurality of sub-objects. The plurality of layers of bounding boxes for each sub-object and the common bounding box for the plurality of sub-objects form a bounding box tree, where a root node is the maximum common bounding box for all sub-objects, and a leaf node is a bounding box of each sub-object.

Alternatively, the object may be a combination of a plurality of other objects. Specifically, for a complex scenario with a plurality of objects, the foregoing method may also be used for establishing one or more layers of common bounding boxes for a group of objects that are adjacent to each other. By doing so, collision detection efficiency described below can be effectively improved. Similarly, a common bounding box of a plurality of objects and a bounding box of each object may be managed in the form of a bounding box tree. A plurality of layers of bounding boxes for each object and the common bounding box for the plurality of objects form a bounding box tree, where a root node is the maximum common bounding box for all objects, and a leaf node is a bounding box of each object.

In the method for determining a plurality of layers of bounding boxes of an object according to this embodiment of the present disclosure, a plurality of layers of bounding boxes that become smaller gradually layer by layer and that accommodate the object therein are constructed layer by layer in an outer-to-inner order. Herein, the bounding box is no longer limited to a geometry with a simple shape, but is a complex geometry having a higher degree of fitting with the object. In comparison, the outermost-layer bounding box is the simplest in geometry, but has the lowest degree of fitting with the object. The innermost-layer bounding box is most complex in geometry, but has the highest degree of fitting with the object. By approximating to an object with a complex shape and a continuous curved surface by using a bounding box, a problem that a related subsequent processing method cannot be applied due to the complex shape of the object can be solved. In addition, by constructing a plurality of layers of bounding boxes, different requirements of subsequent processing can be met.

For example, a type of subsequent processing is object collision detection processing. Specifically, the technical solution according to this embodiment of the present disclosure may be used for collision detection of a real robot. In the real world, a robot needs to avoid an unnecessary collision with an object in an environment to ensure its security, reliability, and efficiency. Therefore, during motion planning and controlling of the robot, it is necessary to determine, according to models and statuses of the robot and the object in the environment, whether the robot will collide unnecessarily with the object in the environment, to generate a reasonable motion and control policy. When the object is an object with a complex shape and a continuous curved surface, collision detection may be performed layer by layer based on a plurality of layers of bounding boxes of the object.

In another example, the technical solution according to this embodiment of the present disclosure may also be used for collision detection between objects in a virtual environment, such as simulation software, a computer game, an animation, and virtual reality. In the virtual environment, when the object is an object with a complex shape and a continuous curved surface, performing collision detection layer by layer based on a plurality of layers of bounding boxes of the object can provide accurate and fast collision detection.

Certainly, a processing method for a three-dimensional object is not limited to collision detection. The method for determining a plurality of layers of bounding boxes of an object according to this embodiment of the present disclosure may be further applied to rendering imaging and the like in computer graphics.

Figure 6:
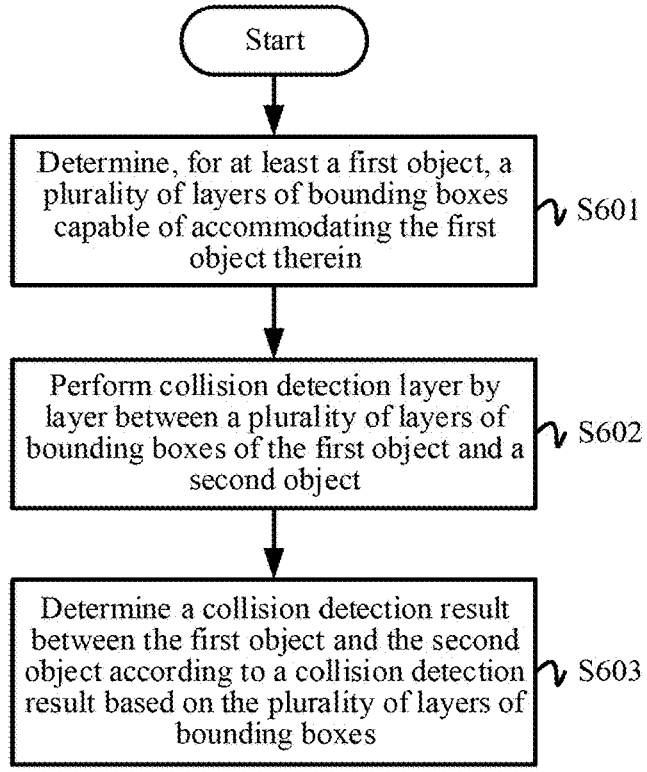
FIG. 6 is a flowchart of an object collision detection method according to an embodiment of the present disclosure.

Next, an object collision detection method according to an embodiment of the present disclosure is described in detail with reference to FIG. 6. As shown in FIG. 6, the object collision detection method includes the following steps.

First, in step S601, for at least a first object, a plurality of layers of bounding boxes capable of accommodating the first object therein are determined. Herein, the plurality of layers of bounding boxes of the first object may be determined completely according to the method for determining a plurality of layers of bounding boxes described above.

Then, in step S602, collision detection is performed layer by layer between the plurality of layers of bounding boxes of the first object and a second object, to obtain a collision detection result based on the plurality of layers of bounding boxes. Herein, "layer by layer" does not necessarily mean performing collision detection at each layer, but may mean performing collision detection every several layers. The expression "layer by layer" is intended to express that collision detection is performed in an outer-to-inner order. In addition, a specific collision detection method is not limited in this embodiment of the present disclosure. Any collision detection method (for example, a GJK distance algorithm or an LC algorithm) may be applied to this embodiment of the present disclosure.

As described above, the outermost-layer bounding box is the simplest in geometry, but has the lowest degree of fitting with the object. During collision detection, if the bounding box is simple in geometry, a calculation amount is small, but a collision detection result is not accurate. If the bounding box is complex in geometry, the calculation amount is relatively large, but the collision detection result is accurate. Therefore, performing collision detection layer by layer based on the plurality of layers of bounding boxes of the object in an outer-to-inner order can reach a good tradeoff between the calculation amount and the accuracy.

Specifically, first, it is determined whether a first-layer bounding box of the first object collides with the second object. Herein, the first-layer bounding box is not necessarily the outermost-layer bounding box. Collision detection may be started from a flexibly selected layer of surrounding box according to a specific situation. If the first-layer bounding box of the first object does not collide with the second object, a collision detection result indicating no collision is generated. If a collision occurs, it is further determined whether a more inner-layer bounding box of the first object collides with the second object. The more inner-layer bounding box is not necessarily an inner-layer bounding box immediately adjacent to the first layer. If the more inner-layer bounding box of the first object does not collide with the second object, a collision detection result indicating no collision is generated. Such processing is repeated until the innermost-layer bounding box of the first object is reached. If the innermost-layer bounding box of the first object collides with the second object, a collision detection result indicating occurrence of a collision is generated.

Finally, in step S603, a collision detection result is determined between the first object and the second object according to the collision detection result based on the plurality of layers of bounding boxes.

Specifically, collision detection is performed by using the plurality of layers of bounding boxes instead of the first object. Therefore, if a collision detection result indicating occurrence of a collision is obtained in step S602, it is determined in step S603 that a collision occurs between the first object and the second object. If a collision detection result indicating no collision is obtained in step S602, it is determined in step S603 that no collision occurs between the first object and the second object.

For example, the second object may be a regular object, a convex geometry with a simple shape, or the like. In this case, a plurality of layers of bounding boxes of the second object do not need to be determined. Alternatively, the outer surface of the second object may be considered as a layer of bounding box of the second object.

Alternatively, the second object may be an object with a complex shape and a continuous curved surface similar to the first object. In this case, a plurality of layers of bounding boxes of the second object also need to be determined. In this case, step S601 further includes: determining, for the second object, a plurality of layers of bounding boxes capable of accommodating the second object therein. Herein, similarly, the plurality of layers of bounding boxes of the second object may be determined completely according to the method for determining a plurality of layers of bounding boxes described above.

In addition, in this case, step S602 includes: performing collision detection layer by layer between the plurality of layers of bounding boxes based on the plurality of layers of bounding boxes of the first object and the plurality of layers of bounding boxes of the second object, to obtain the collision detection result based on the plurality of layers of bounding boxes.

Similarly, collision detection is performed layer by layer in an outer-to-inner order based on the plurality of layers of bounding boxes of the first object and the second object. Specifically, the performing collision detection layer by layer between the plurality of layers of bounding boxes based on the plurality of layers of bounding boxes of the first object and the plurality of layers of bounding boxes of the second object further includes the following steps.

First, based on the first-layer bounding box of the first object and a first-layer bounding box of the second object, it is determined whether a collision occurs.

Then, it is determined, in response to determining that a collision occurs between the first-layer bounding box of the first object and the first-layer bounding box of the second object, whether a second-layer bounding box that meets a first predetermined condition exists for at least one of the first object and the second object: and further determined, in response to existence of the second-layer bounding box that meets the first predetermined condition and based on the second-layer bounding box, whether a collision occurs.

Herein, the second-layer bounding box refers to a more inner-layer bounding box than the first-layer bounding box, and is not necessarily a more inner-layer bounding box immediately adjacent to the first-layer bounding box.

Figure 7:
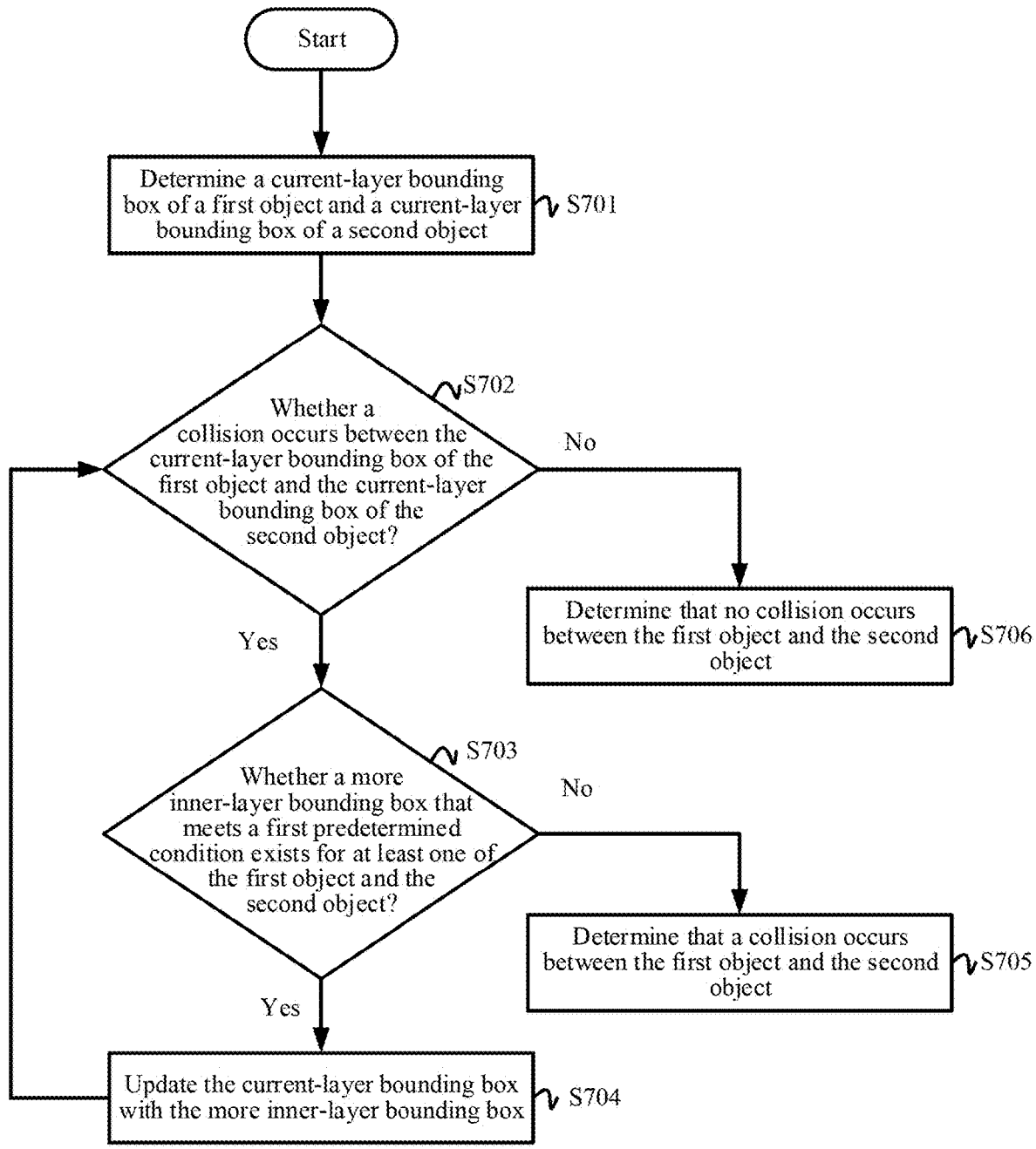
FIG. 7 is a flowchart of an object collision detection method according to another embodiment of the present disclosure.

A basic process of collision detection is briefly described above by using only two layers as an example. Next, an object collision detection method according to another embodiment of the present disclosure is described with reference to FIG. 7. The object collision detection method shown in FIG. 7 is for a case in which both objects have a plurality of layers of bounding boxes. As shown in FIG. 7, the object collision detection method includes the following steps.

First, in step S701, a current-layer bounding box of a first object and a current-layer bounding box of a second object are determined. Similarly, herein, the current-layer bounding box is not necessarily the outermost-layer bounding box. Collision detection may be started from a flexibly selected layer of surrounding box according to a specific situation.

Then, in step S702, it is determined whether a collision occurs between the current-layer bounding box of the first object and the current-layer bounding box of the second object.

If it is determined in step S702 that a collision occurs, the processing proceeds to step S703. In step S703, it is determined whether a more inner-layer bounding box that meets a first predetermined condition exists for at least one of the first object and the second object.

If it is determined in step S703 that a more inner-layer bounding box exists, the processing proceeds to step S704. In step S704, the current-layer bounding box is updated with the more inner-layer bounding box. Then, the processing returns to step S702. In addition, if it is determined in step S703 that no more inner-layer bounding box exists, the processing proceeds to step S705. In step S705, it is determined that a collision occurs between the first object and the second object, and the processing ends.

In addition, if it is determined in step S702 that no collision occurs, the processing proceeds to step S706. In step S706, it is determined that no collision occurs between the first object and the second object, and the processing ends.

Figure 8A:
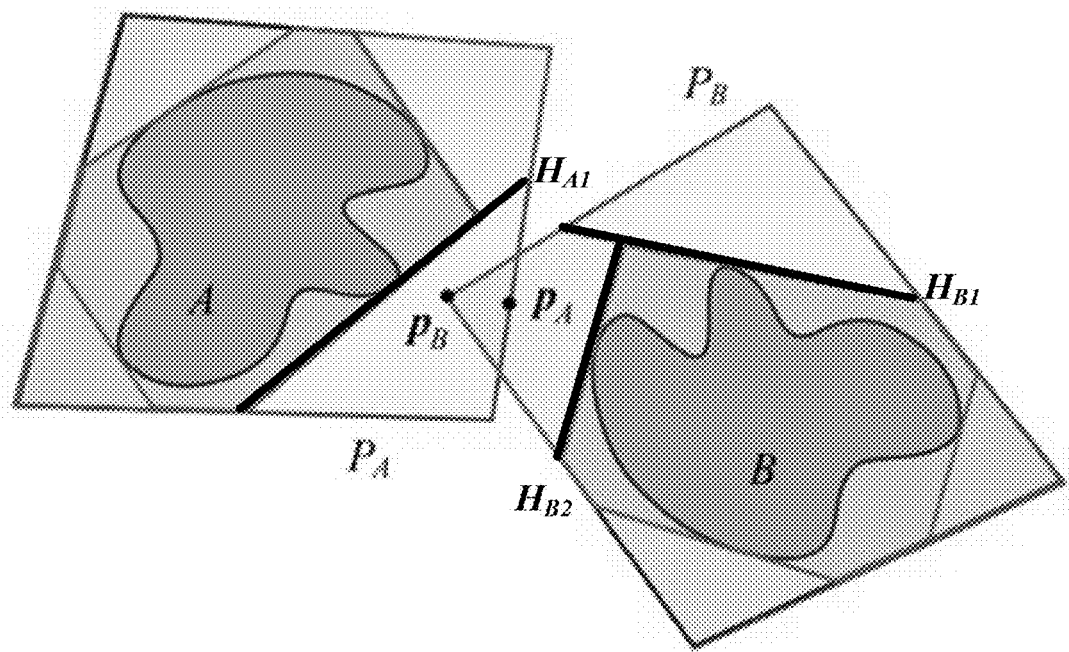
FIG. 8A and FIG. 8B are schematic diagrams of principles for determining whether a second-layer or more inner-layer bounding box exists.
Figure 8B:
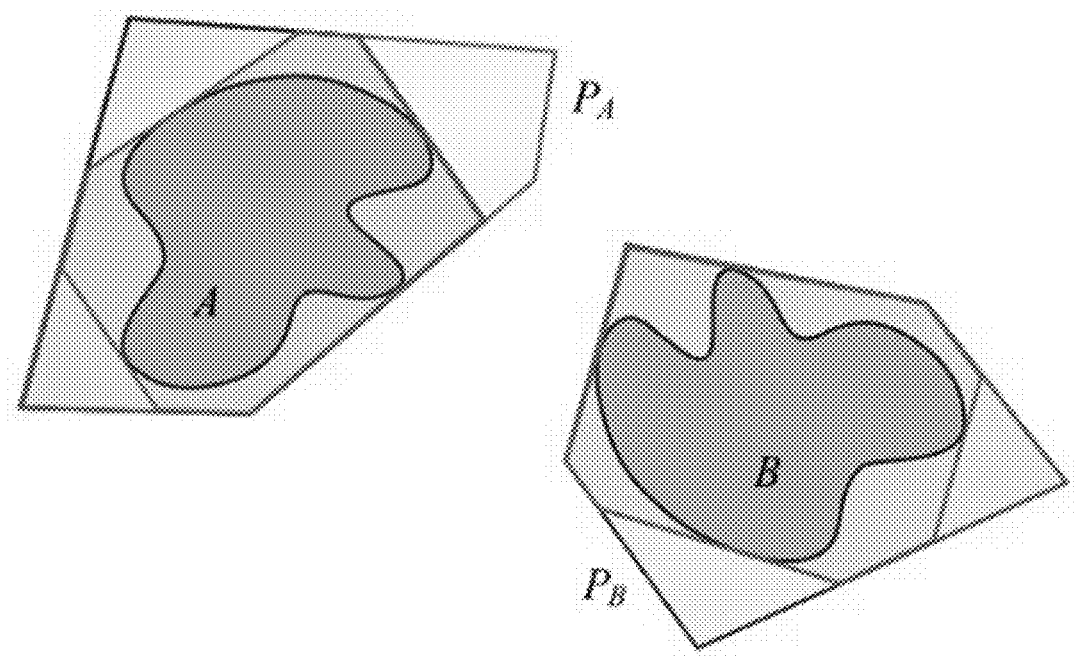

FIG. 8A and FIG. 8B are schematic diagrams of principles for determining whether a second-layer or more inner-layer bounding box exists. In FIG. 8A and FIG. 8B, A and B respectively represent the first object and the second object, and $P_A$ and $P_a$ respectively represent the current-layer bounding box of the first object and the current-layer bounding box of the second object. Next, referring to FIG. 8A and FIG. 8B, a specific process of determining whether a second-layer bounding box that meets the first predetermined condition exists for at least one of the first object and the second object is described in detail.

First, determine a first point and a second point respectively on the first-layer bounding box of the first object and the first-layer bounding box of the second object, so that the first point and the second point meet a second predetermined condition. FIG. 8A shows a case in which the first-layer bounding box of the first object collides with a second-layer bounding box of the second object. In this case, point $p_A$ and point $p_B$ are respectively determined at the first-layer bounding box of the first object and the first-layer bounding box of the second object. For example, the second predetermined condition may be that a distance between $P_A$ and $p_B$ is penetration depth of a polyhedron. The penetration depth is the minimum translational distance that separates two cross geometries. Alternatively, in another example, the second predetermined condition may be $P_A \in P_B$ and $p_B \in P_A$.

Then, the plurality of layers of bounding boxes of first object A are searched for a first support plane capable of separating first object A from first point $P_A$. In FIG. 8A, such a first support plane $H_{A1}$ exists in the plurality of layers of bounding boxes of first object A. In addition, the plurality of layers of bounding boxes of the second object are searched for a second support plane capable of separating the second object from the second point. In FIG. 8A, such second support planes $H_{B1}$ and $H_{B2}$ exist in the plurality of layers of bounding boxes of second object B.

In response to a determination that at least one of the first support plane and the second support plane can be found, it is determined that the second-layer bounding box or a more inner-layer bounding box that meets the first predetermined condition exists for at least one of the first object and the second object. In the case shown in FIG. 8A, the first support plane and the second support plane can be found. Therefore, it is determined that the second-layer bounding box or a more inner-layer bounding box that meets the first predetermined condition exists for at least one of the first object and the second object. Certainly, as long as one of the first support plane and the second support plane can be found, it may be determined that there is a second-layer bounding box or a more inner-layer bounding box.

FIG. 8B shows a second-layer bounding box determined in response to a determination that a collision occurs at the first-layer bounding box. As shown in FIG. 8B, for first object A, the second-layer bounding box or the more inner-layer bounding box is a bounding box immediately adjacent to the first layer. However, for second object B, the second-layer bounding box or the more inner-layer bounding box is not a bounding box immediately adjacent to the first layer.

As described above, both the first object and the second object may be independent complete objects.

Alternatively, the first object may be a sub-object obtained by segmenting another object. When the first object has a special shape, if a plurality of layers of bounding boxes are determined for the entire object, space that does not belong to the object may be surrounded. In other words, even the innermost-layer bounding box does not fit the object high enough. In this case, the first object needs to be segmented to improve the degree of fitting between the bounding box and the first object.

In response to a determination that the first object is segmented into a plurality of sub-objects, the determining a plurality of layers of bounding boxes capable of accommodating the first object therein further includes: determining a plurality of layers of bounding boxes of each sub-object.

In addition, referring back to FIG. 6, step S602 of performing collision detection layer by layer between the plurality of layers of bounding boxes of the first object and a second object further includes: performing collision detection layer by layer between the plurality of layers of bounding boxes of each sub-object and the second object in response to determining that a collision occurs between the plurality of layers of bounding boxes of the first object and the second object.

A swim ring is still used as an example for description. When the first object is a swim ring, the plurality of layers of bounding boxes of the first object include a hollow part. In this case, if the first object is not segmented, and collision detection is performed by using the plurality of layers of bounding boxes of the first object, a detection result indicating occurrence of a collision between the first object and the second object is to be generated if the second object passes through the hollow part of the swim ring. Obviously, the collision result is incorrect. To avoid this error, when it is determined that the plurality of layers of bounding boxes of the first object collide with the second object, collision detection may be further performed layer by layer between the plurality of layers of bounding boxes of each sub-object and the second object. In response to a determination that the second object passes through the hollow part of the swim ring, it is determined that no collision occurs between the plurality of layers of bounding boxes of each sub-object and the second object. Therefore, a correct detection result indicating no collision between the first object and the second object is finally obtained.

In addition, in this case, for example, the bounding boxes of the entire object and the sub-objects may be managed in a form of a bounding box tree. The plurality of layers of bounding boxes for each sub-object and the common bounding box for the plurality of sub-objects form a bounding box tree, where a root node is the maximum common bounding box for all sub-objects, and a leaf node is a bounding box of each sub-object. It is successively determined, in a sequence from the root node to the leaf node, whether a corresponding bounding box collides with the bounding box of the second object.

Alternatively, the object may be a combination of a plurality of other objects. Specifically, for a complex scenario with a plurality of objects, the foregoing method may also be used for establishing one or more layers of common bounding boxes for a group of objects that are adjacent to each other.

In response to a determination that the first object is included in a group of objects, the method further includes: determining at least one layer of common bounding box of the group of objects.

In addition, referring back to FIG. 6, before step S602 of performing collision detection layer by layer between the plurality of layers of bounding boxes of the first object and a second object, the method further includes: performing collision detection between the at least one layer of common bounding box of the group of objects and the second object. Step S602 of performing collision detection layer by layer between the plurality of layers of bounding boxes of the first object and a second object is performed in response to a determination that the at least one layer of common bounding box of the group of objects collides with the second object.

By doing so, collision detection efficiency can be effectively improved. Specifically, because the common bounding box of the group of objects is generally relatively simple in shape, a calculation amount of performing collision detection is relatively small. If it is determined that no collision occurs between the common bounding box of the group of objects and the second object, it is unnecessary to further determine, based on the plurality of layers of bounding boxes of the first object, whether a collision occurs with the second object, thereby improving collision detection efficiency.

Similarly, a common bounding box of a plurality of objects and a bounding box of each object may be managed in the form of a bounding box tree. A plurality of layers of bounding boxes for each object and the common bounding box for the plurality of objects form a bounding box tree, where a root node is the maximum common bounding box for all objects, and a leaf node is a bounding box of each object. In this case, it is successively determined, in a sequence from the root node to the leaf node corresponding to the first object, whether a corresponding bounding box collides with the bounding box of the second object.

In the object collision detection method according to this embodiment of the present disclosure, collision detection is performed layer by layer based on a plurality of layers of bounding boxes, and a good tradeoff can be reached between collision detection efficiency and accuracy.

As described above, during motion planning and controlling of the robot, it is necessary to determine, according to models and statuses of the robot and the object in the environment, whether the robot will collide unnecessarily with the object in the environment, to generate a reasonable motion and control policy. In addition, accurate collision detection also needs to be performed for a virtual object in a virtual environment. Therefore, the collision detection method based on a plurality of layers of bounding boxes may be applied to a motion control field of a robot or a virtual object.

Specifically, in an implementation, a motion control method may include the following steps.

First, for at least one of a target object and an obstacle object, a plurality of layers of bounding boxes are determined capable of accommodating the object therein. The target object may be the foregoing physical robot, or may be the virtual object in the foregoing virtual environment. The target object may be of a regular geometry or may be of an irregular geometry, and a plurality of layers of bounding boxes of the target object need to be determined for use in subsequent collision detection. The obstacle object is an object placed in an environment, such as a table, a chair, or a wall. The obstacle object is usually static, and may form an obstacle to a moving object. Therefore, there is a requirement for planning a motion path of the target object, so that when moving in the environment, the target object does not collide with the obstacle object in the environment.

Then, an intermediate location of a first movement is determined based on a start location of the target object.

Next, a motion path of the target object is determined at least based on the intermediate location of the first movement.

Finally, the target object is controlled to move according to the motion path.

For example, in the motion control method according to an implementation of the present disclosure, the motion path of the target object may be determined in a single step.

In this case, the determining an intermediate location of a first movement based on a start location of the target object further includes the following steps.

First, a plurality of candidate locations of the first movement are determined based on the start location of the target object. For example, the plurality of candidate locations herein may be generated through random sampling. Alternatively, preliminary screening may be performed in a plurality of candidate locations generated through random sampling. For example, a candidate location having a moving direction deviating from a destination location is deleted.

Then, for each of the plurality of candidate locations according to the layer-by-layer collision detection method based on a plurality of layers of bounding boxes described above, it is determined whether the target object collides with the obstacle object in response to a determination that the target object is located at the candidate location. A candidate location is selected at which no collision with the obstacle object occurs as the intermediate location of the first movement. Whether a collision occurs is determined in response to a determination that the target object is assumed to be in the candidate location. However, in fact, the target object does not move before the motion path is determined.

As described above, for at least one of the target object and the obstacle body, the determining, for at least one of a target object and an obstacle object, a plurality of layers of bounding boxes capable of accommodating the object therein includes determining a polyhedron capable of accommodating the object therein as a first-layer bounding box, and selecting one vertex from a plurality of vertices of the first-layer bounding box as a target vertex. The determining the plurality of layers of bounding boxes further includes determining a support plane whose normal vector is a specific direction corresponding to the target vertex, the support plane being a plane passing through a point on a surface of the object and causing the object to be completely located on one side, and cutting the current-layer bounding box based on at least the support plane to form a smaller bounding box, as a second-layer bounding box. In this embodiment, the current-layer bounding box is the first-layer bounding box.

In response to a determination that motion path planning is the single-step planning described above, the selecting a candidate location at which no collision with the obstacle object occurs as the intermediate location of the first movement further includes: selecting a candidate location closest to a destination location of the target object as the intermediate location of the first movement in response to a determination that there are a plurality of candidate locations at which no collision with the obstacle object occurs. In this case, the determining a motion path of the target object at least based on the intermediate location of the first movement further includes: using a motion path from the start location of the target object to the intermediate location of the first movement as the motion path of the target object.

Certainly, the motion control method according to this embodiment of the present disclosure is not limited to the foregoing single-step motion path planning. In another implementation, multi-step motion path planning may alternatively be performed. For example, unlike single-step planning, in multi-step planning, a complete motion path from the start location to the destination location may be determined. In addition, after the complete motion path is determined, the target object is controlled to move according to the determined motion path.

In this case, the selecting a candidate location at which no collision with the obstacle object occurs as the intermediate location of the first movement further includes: selecting, in response to a determination that there are a plurality of candidate locations at which no collision with the obstacle object occurs, the plurality of candidate locations at which no collision with the obstacle object occurs as intermediate locations of the first movement. For example, all candidate locations at which no collision with the obstacle object occurs may be used as possible intermediate locations of the first movement. Alternatively, some candidate locations at which no collision with the obstacle object occurs may be all used as possible intermediate locations of the first movement.

In addition, in this case, the method further includes: respectively determining an intermediate location of a second movement based on each intermediate location of the first movement, and determining an intermediate location of a third movement based on the intermediate location of the second movement until the destination location of the target object is reached. That is, in the case of multi-step planning, a location of a next movement is constantly determined based on a current location by using repeated iteration processing. Because a plurality of candidate locations at which no collision with the obstacle object occurs are selected as intermediate locations of the first movement, in other words, there are a plurality of possible intermediate locations of the first movement. Similarly, it may be understood that when a possible intermediate location of the first movement is used as a current location, a plurality of possible intermediate locations of the second movement may also exist when an intermediate location of a next movement (that is, the second movement) is determined. Thus, after an intermediate location of a next movement is predicted one by one until the destination location is reached, there will be a plurality of possible motion paths from the start location to the destination location.

Specifically, the determining the motion path of the target object at least based on the selected intermediate location of the first movement further includes: forming a plurality of motion paths from the start location of the target object to the destination location by connecting intermediate locations of all the movements; and selecting one of the plurality of motion paths as the motion path of the target object based on a predetermined policy.

For example, in an implementation, the selecting one of the plurality of motion paths as the motion path of the target object based on a predetermined policy further includes: selecting, from the plurality of motion paths, one path with the shortest movement distance or requiring the shortest movement time as the motion path of the target object.

Next, a device for determining a plurality of layers of bounding boxes of an object according to an embodiment of the present disclosure is described with reference to FIG. 9.

Figure 9:
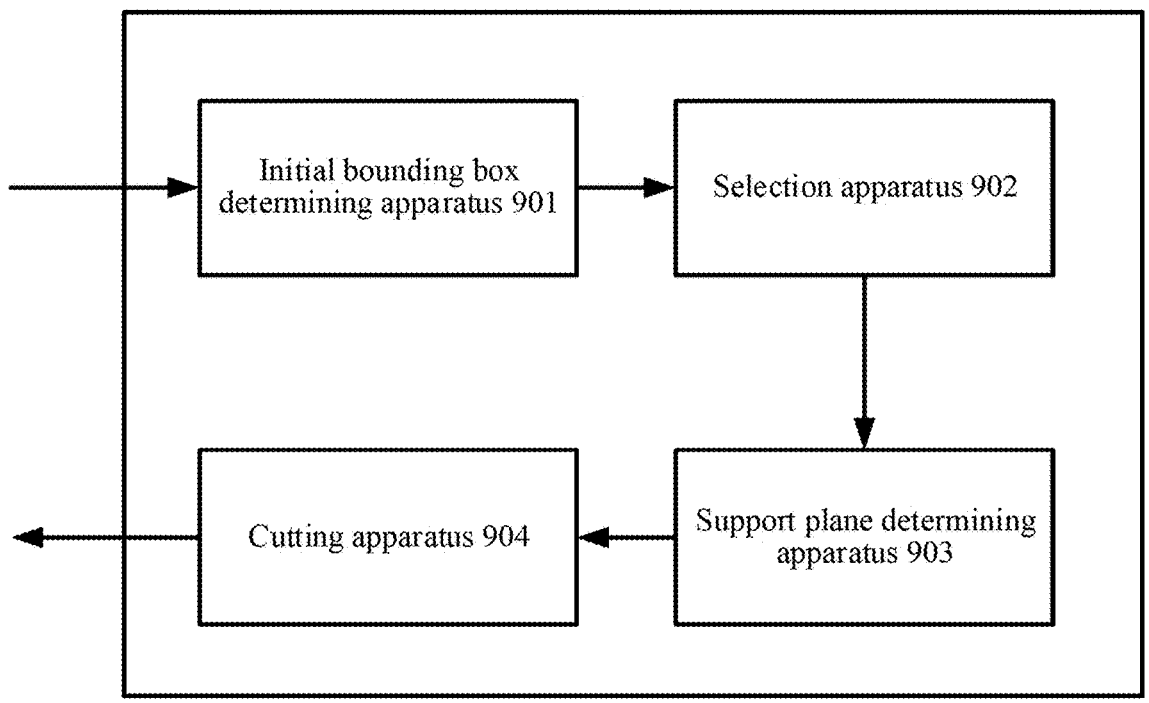
FIG. 9 is a functional block diagram of a device for determining a plurality of layers of bounding boxes of an object according to an embodiment of the present disclosure.

As shown in FIG. 9, a device 900 configured to determine a plurality of layers of bounding boxes of an object includes an initial bounding box determining apparatus 901, a selection apparatus 902, a support plane determining apparatus 903, and a cutting apparatus 904. One or more of the apparatuses can be implemented by processing circuitry, software, or a combination thereof, for example.

The initial bounding box determining apparatus 901 is configured to determine a polyhedron capable of accommodating the object therein as a first-layer bounding box.

For example, the initial bounding box determining apparatus 901 may determine the first-layer bounding box in any selected manner, as long as the object can be accommodated therein, regardless of a size of the first-layer bounding box and a degree of fitting with the object.

Alternatively, in another implementation, the initial bounding box determining apparatus 901 may determine the first-layer bounding box by performing the following processing:

First, select a group of direction vectors. The group of direction vectors includes at least four direction vectors. For example, the group of direction vectors may be normal vectors of four faces of a space regular tetrahedron. In this case, the formed first-layer bounding box will also be a regular tetrahedron. In another example, the group of direction vectors may include six direction vectors in positive and negative directions along three coordinate axes (x, y, z). In this case, the formed first-layer bounding box will be a cuboid aligned with the coordinate axes.

Then, respectively determine a plurality of support planes of the object that use each direction vector as a normal vector. In addition, use a polyhedron formed by the plurality of support planes as the first-layer bounding box.

The selection apparatus 902 is configured to select one vertex from a plurality of vertices of the first-layer bounding box as a target vertex.

For example, the selection apparatus 902 may select any one of the plurality of vertices of the first-layer bounding box as the target vertex.

Alternatively, in another implementation, the selection apparatus 902 may select a specific one of the plurality of vertices of the first-layer bounding box as the target vertex. Specifically, the selection apparatus 902 may select one vertex of the plurality of vertices of the first-layer bounding box as the target vertex through the following processing: First, the selection apparatus 902 determines a shortest distance from each vertex of the first-layer bounding box to a surface of the object. Then, the selection apparatus 902 selects the largest one of all the shortest distances as a first distance. Finally, the selection apparatus 902 uses a vertex corresponding to the first distance as the target vertex. That is, one vertex farthest from the surface of the object is selected from the plurality of vertices of the first-layer bounding box as the target vertex. Through such selection, the processing described below for cutting the first-layer bounding box by using the support plane can cut off as many portions as possible of the first-layer bounding box, so that the newly formed second-layer bounding box can more closely fit the object, and the innermost-layer bounding box can be converged at the fastest speed.

For example, in an implementation, the selection apparatus 902 may calculate, for each vertex, distances from the vertex to all points on the surface of the object, and determine the shortest distance among these distances.

In another example, in another implementation, for each vertex, a distance from the vertex to a corresponding support plane may also be calculated as the shortest distance from the vertex to the surface of the object.

Specifically, the selection apparatus 902 may be further configured to determine the shortest distance from each vertex of the first-layer bounding box to the surface of the object by performing the following processing: respectively performing the following processing for each vertex of the first-layer bounding box:

First, determine a specific direction corresponding to a vertex of the first-layer bounding box. The specific direction corresponding to the vertex described herein may be randomly selected, or may be a direction along an average value of outward normal vectors of all planes that include the vertex and that are in the first-layer bounding box. In the first-layer bounding box, an outward normal vector of a plane refers to a direction perpendicular to the plane and pointing away from the first-layer bounding box.

Then, determine a support plane whose normal vector is the specific direction corresponding to the vertex and that is closest to the vertex. For example, there may be only one support plane that can pass through a point on the surface of the object and that causes the object to be located on one side thereof, or there may be a plurality of (for example, two) support planes that can pass through a point on the surface of the object and that cause the object to be located on one side thereof. Thus, in the latter case, a support plane closest to the vertex is selected from the plurality of support planes.

Finally, calculate a distance from the vertex to the support plane as a shortest distance from the vertex to the surface of the object.

The support plane determining apparatus 903 is configured to determine a support plane whose normal vector is a specific direction corresponding to the target vertex and that is closest to the target vertex, the support plane being a plane passing through a point on a surface of the object and causing the object to be completely located on one side of the plane. For example, there may be only one support plane that can pass through a point on the surface of the object and that causes the object to be located on one side thereof, or there may be a plurality of (for example, two) support planes that can pass through a point on the surface of the object and that cause the object to be located on one side thereof. Thus, in the latter case, a support plane closest to the vertex is selected from the plurality of support planes.

The foregoing describes a case in which the selection apparatus 902 determines a support plane corresponding to each vertex, and uses a distance from each vertex to a corresponding support plane as the shortest distance from the vertex to the surface of the object. In this case, the support plane determining apparatus 903 may directly use the support plane of the target vertex obtained by the selection apparatus 902 without needing to re-determine the support plane. Certainly, if the selection apparatus 902 determines the shortest distance from each vertex to the surface of the object by using another method, the support plane determining apparatus 903 needs to re-determine the support plane corresponding to the target vertex.

The cutting apparatus 904 is configured to cut the first-layer bounding box based on at least the support plane to form a smaller bounding box, as a second-layer bounding box.

In addition, in the foregoing description, the selection apparatus 902 selects one vertex from the plurality of vertices of the first-layer bounding box as the target vertex. The support plane determining apparatus 903 determines the support plane corresponding to the target vertex. In addition, the cutting apparatus 904 cuts the first-layer bounding box by using the determined support plane, to obtain the second-layer bounding box. However, this embodiment of the present disclosure is not limited thereto. For example, the selection apparatus 902 may also select a plurality of (for example, two) vertices from the plurality of vertices of the first-layer bounding box as target vertices. For example, the selection apparatus 902 may select two vertices corresponding to the largest one and the secondary largest one of all shortest distances as the target vertices. Then, the cutting apparatus 904 cuts the first-layer bounding box by using two support planes corresponding to the two target vertices to form the second-layer bounding box.

Next, specific operations of the support plane determining apparatus 903 shown are described. The support plane determining apparatus 903 is further configured to perform the following processing:

First, determine a plurality of planes whose normal vectors are the specific direction corresponding to the target vertex and that pass through a point on the surface of the object.

Then, calculate a product of a distance from a coordinate origin to each plane and a corresponding coefficient as a distance parameter, the corresponding coefficient being a positive value in response to a determination that a direction of a vertical line from the coordinate origin to the plane is the same as the specific direction; otherwise, the corresponding coefficient being a negative value.

Next, determine the maximum value of the distance parameter. Because the distance parameter is a value with a positive symbol or a negative symbol, when a plurality of distance parameters are all positive values, the maximum value of the distance parameters corresponds to the maximum distance from the coordinate origin to the plane. When the plurality of distance parameters are all negative values, the maximum value of the distance parameters corresponds to the minimum distance from the coordinate origin to the plane. Alternatively, when the plurality of distance parameters have both positive and negative values, the maximum value of the distance parameters corresponds to the maximum positive distance parameter.

In addition, as described above, the coordinate origin may be randomly set. In addition, in an implementation, the specific direction corresponding to the target vertex is an average direction of outward normal vectors of all planes including the target vertex in a current-layer bounding box. That is, the specific direction corresponding to the target vertex is a direction away from the object. Therefore, if the coordinate origin and the target vertex are respectively located on two sides of a plane, a direction of a vertical line from the coordinate origin to the plane is the same as the specific direction; otherwise, if the coordinate origin and the target vertex are on the same side of a plane, a direction of a vertical line from the coordinate origin to the plane is opposite to the specific direction.

In an implementation, the coordinate origin may alternatively be set on the target vertex. In this case, because the coordinate origin and the target vertex are located on the same sides of a plurality of planes, all distance parameters are negative values. Therefore, processing performed by the support plane determining apparatus 903 is equivalent to determining the minimum value of distances from the target vertex to the plurality of planes.

In an implementation, the support plane determining apparatus 903 is further configured to determine the maximum value of the distance parameter by performing the following processing: performing at least one time of segmentation on a value domain of the object to obtain a plurality of subdomains, and respectively determining a plurality of upper bounds of a support function that correspond to the plurality of subdomains, the support function being a function for calculating the maximum value of the distance parameter, and the upper bound of the support function decreases with segmentation on the value domain. The plane determining apparatus 903 is further configured to determine a temporary solution of the support function, and select, based on the temporary solution of the support function, one of the plurality of upper bounds of the support function that correspond to the plurality of subdomains as the maximum value of the distance parameter.

In addition, the support plane determining apparatus 903 is further configured to determine the temporary solution of the support function in advance, or update the temporary solution of the support function through the following processing: solving, in response to a determination that an upper bound of the support function in a subdomain is greater than the temporary solution of the support function and a size of the subdomain is less than a first predetermined threshold, the support function in the subdomain; and updating, in response to a determination that a solved value of the support function is greater than the temporary solution of the support function, the temporary solution of the support function with the solved value of the support function.

In addition, the support plane determining apparatus 903 is further configured to select an upper bound as the maximum value of the distance parameter by performing the following processing: selecting, from the plurality of upper bounds, an upper bound whose difference from the temporary solution of the support function is greater than 0 and less than a second predetermined threshold as the maximum value of the distance parameter.

Specific details of the foregoing processing are completely corresponding to those of the processes described above with reference to FIG. 4 and FIG. 5. Therefore, to avoid redundancy, details are not described herein again.

Finally, the support plane determining apparatus 903 determines a plane corresponding to the maximum value of the distance parameter in the plurality of planes as the support plane.

The specific configuration and operation of the device 900 for determining a plurality of layers of bounding boxes of an object are described in detail above. The object herein may be an independent complete object.

Alternatively, the object may be a sub-object obtained by segmenting another object. When an object has a special shape, if a plurality of layers of bounding boxes are determined for the entire object, space that does not belong to the object may be surrounded. In other words, even the innermost-layer bounding box does not fit the object high enough. In this case, the object needs to be segmented to improve the degree of fitting between the bounding box and the object. For ease of understanding, a shape of a swim ring is used as an example for description. It is assumed that the object is an object in a shape of a swim ring. In this case, a bounding box determined for the entire object includes a hollow part of the swim ring. To avoid this case, it may be considered to segment the object into a plurality of sub-objects, and construct a plurality of layers of bounding boxes for each sub-object. In this way, the plurality of layers of bounding boxes determined for each sub-object effectively avoid including the hollow part of the swim ring.

In this case, for example, the bounding boxes of the entire object and the sub-objects may be managed in a form of a bounding box tree. Specifically, by using the foregoing device, a plurality of layers of bounding boxes of each sub-object are determined, and one or more layers of common bounding boxes are determined for the plurality of sub-objects. The plurality of layers of bounding boxes for each sub-object and the common bounding box for the plurality of sub-objects form a bounding box tree, where a root node is the maximum common bounding box for all sub-objects, and a leaf node is a bounding box of each sub-object.

Alternatively, the object may be a combination of a plurality of other objects. Specifically, for a complex scenario with a plurality of objects, the foregoing device may also be used for establishing one or more layers of common bounding boxes for a group of objects that are adjacent to each other. By doing so, collision detection efficiency described below can be effectively improved. Similarly, a common bounding box of a plurality of objects and a bounding box of each object may be managed in the form of a bounding box tree. A plurality of layers of bounding boxes for each object and the common bounding box for the plurality of objects form a bounding box tree, where a root node is the maximum common bounding box for all objects, and a leaf node is a bounding box of each object.

In the device for determining a plurality of layers of bounding boxes of an object according to this embodiment of the present disclosure, a plurality of layers of bounding boxes that become smaller gradually layer by layer and that accommodate the object therein are constructed layer by layer in an outer-to-inner order. Herein, the bounding box is no longer limited to a geometry with a simple shape, but is a complex geometry having a higher degree of fitting with the object. In comparison, the outermost-layer bounding box is the simplest in geometry, but has the lowest degree of fitting with the object. The innermost-layer bounding box is most complex in geometry, but has the highest degree of fitting with the object. By approximating to an object with a complex shape and a continuous curved surface by using a bounding box, a problem that a related subsequent processing method cannot be applied due to the complex shape of the object can be solved. In addition, by constructing a plurality of layers of bounding boxes, different requirements of subsequent processing can be met.

Figure 10:
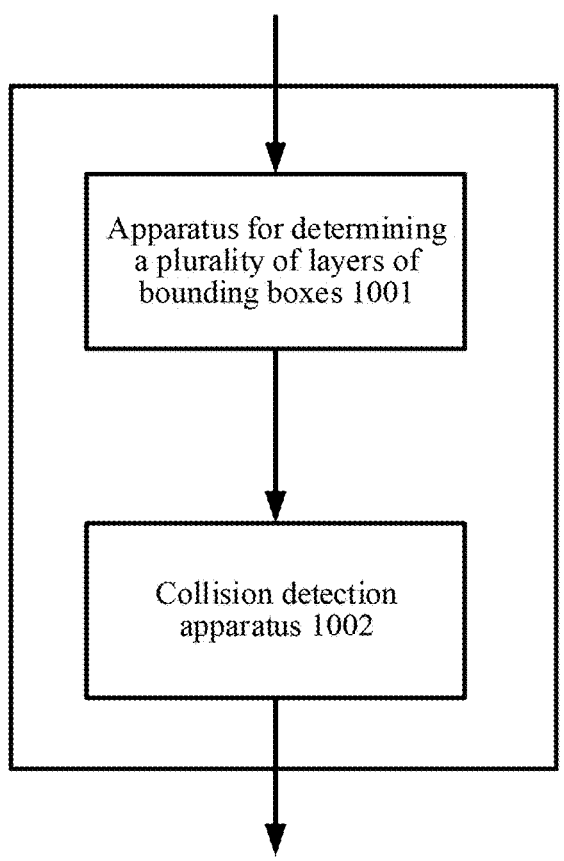
FIG. 10 is a functional block diagram of an object collision detection device according to an embodiment of the present disclosure.

Next, an object collision detection device according to an embodiment of the present disclosure is described with reference to FIG. 10. As shown in FIG. 10, the object collision detection device 1000 includes an apparatus 1001 for determining a plurality of layers of bounding boxes and a collision detection apparatus 1002. One or more of the apparatuses can be implemented by processing circuitry, software, or a combination thereof, for example.

The apparatus 1001 for determining a plurality of layers of bounding boxes is configured to determine, for at least a first object, a plurality of layers of bounding boxes capable of accommodating the first object therein.

The apparatus 1001 for determining a plurality of layers of bounding boxes is similar to the device 900 for determining a plurality of layers of bounding boxes of an object described with reference to FIG. 9, and is further configured to perform the following processing:

First, determine a polyhedron capable of accommodating the first object therein as a first-layer bounding box.

Then, select one vertex from a plurality of vertices of the first-layer bounding box as a target vertex.

Next, determine a support plane whose normal vector is a specific direction corresponding to the target vertex, the support plane being a plane passing through a point on a surface of the first object and causing the first object to be completely located on one side.

Finally, cut the current-layer bounding box based on at least the support plane form a smaller bounding box, as a second-layer bounding box. In this embodiment, the current-layer bounding box is the first-layer bounding box.

The collision detection apparatus 1002 is configured to perform collision detection layer by layer between the plurality of layers of bounding boxes of the first object and a second object, to obtain a collision detection result based on the plurality of layers of bounding boxes. Herein, "layer by layer" does not necessarily mean performing collision detection at each layer, but may mean performing collision detection every several layers. The expression "layer by layer" is intended to express that collision detection is performed in an outer-to-inner order. In addition, a specific collision detection method is not limited in this embodiment of the present disclosure. Any collision detection method (for example, a GJK distance algorithm or an LC algorithm) may be applied to this embodiment of the present disclosure.

As described above, the outermost-layer bounding box is the simplest in geometry, but has the lowest degree of fitting with the object. During collision detection, if the bounding box is simple in geometry, a calculation amount is small, but a collision detection result is not accurate. If the bounding box is complex in geometry, the calculation amount is relatively large, but the collision detection result is accurate. Therefore, performing collision detection layer by layer based on the plurality of layers of bounding boxes of the object in an outer-to-inner order can reach a good tradeoff between the calculation amount and the accuracy.

Specifically, first, the collision detection apparatus 1002 determines whether a first-layer bounding box of the first object collides with the second object. Herein, the first-layer bounding box is not necessarily the outermost-layer bounding box. Collision detection may be started from a flexibly selected layer of surrounding box according to a specific situation. If the first-layer bounding box of the first object does not collide with the second object, a collision detection result indicating no collision is generated. If a collision occurs, it is further determined whether a more inner-layer bounding box of the first object collides with the second object. The more inner-layer bounding box is not necessarily an inner-layer bounding box immediately adjacent to the first layer. If the more inner-layer bounding box of the first object does not collide with the second object, a collision detection result indicating no collision is generated. Such processing is repeated until the innermost-layer bounding box of the first object is reached. If the innermost-layer bounding box of the first object collides with the second object, a collision detection result indicating occurrence of a collision is generated.

In addition, the collision detection apparatus 1002 determines a collision detection result between the first object and the second object according to the collision detection result based on the plurality of layers of bounding boxes. Specifically, collision detection is performed by using the plurality of layers of bounding boxes instead of the first object. Therefore, if a collision detection result indicating occurrence of a collision is obtained, the collision detection apparatus 1002 determines that a collision occurs between the first object and the second object. If a collision detection result indicating no collision is obtained, the collision detection apparatus 1002 determines that no collision occurs between the first object and the second object.

For example, the second object may be a regular object, a convex geometry with a simple shape, or the like. In this case, a plurality of layers of bounding boxes of the second object do not need to be determined. Alternatively, the outer surface of the second object may be considered as a layer of bounding box of the second object.

Alternatively, the second object may be an object with a complex shape and a continuous curved surface similar to the first object. In this case, a plurality of layers of bounding boxes of the second object also need to be determined. In this case, the apparatus 1001 for determining a plurality of layers of bounding boxes is further configured to: determine, for the second object, a plurality of layers of bounding boxes capable of accommodating the second object therein.

In addition, in this case, the collision detection apparatus 1002 is further configured to: perform collision detection layer by layer between the plurality of layers of bounding boxes based on the plurality of layers of bounding boxes of the first object and the plurality of layers of bounding boxes of the second object, to obtain the collision detection result based on the plurality of layers of bounding boxes.

Collision detection is performed layer by layer in an outer-to-inner order based on the plurality of layers of bounding boxes of the first object and the second object. Specifically, the collision detection apparatus 1002 is further configured to perform the following processing:

First, determine, based on the first-layer bounding box of the first object and a first-layer bounding box of the second object, whether a collision occurs; and determine, in response to determining that a collision occurs between the first-layer bounding box of the first object and the first-layer bounding box of the second object, whether a second-layer bounding box that meets a first predetermined condition exists for at least one of the first object and the second object; and further determine, in response to existence of the second-layer bounding box that meets the first predetermined condition and based on the second-layer bounding box, whether a collision occurs.

Herein, the second-layer bounding box refers to a more inner-layer bounding box than the first-layer bounding box, and is not necessarily a more inner-layer bounding box immediately adjacent to the first-layer bounding box.

The collision detection apparatus 1002 is further configured to determine, by performing the following processing, whether a second-layer bounding box that meets a first predetermined condition exists for at least one of the first object and the second object.

First, determine a first point and a second point respectively on the first-layer bounding box of the first object and the first-layer bounding box of the second object, so that the first point and the second point meet a second predetermined condition. For example, the second predetermined condition may be that a distance between a first point and a second point is a penetration depth of a polyhedron. The penetration depth is the minimum translational distance that separates two cross geometries. Alternatively, in another example, the second predetermined condition may be that a first point belongs to the first-layer bounding box of the second object and the second point belongs to the first-layer bounding box of the first object.

Then, search the plurality of layers of bounding boxes of the first object for a first support plane capable of separating the first object from the first point, and search the plurality of layers of bounding boxes of the second object for a second support plane capable of separating the second object from the second point; and determine, in response to a determination that at least one of the first support plane and the second support plane can be found, that the second-layer bounding box that meets the first predetermined condition exists for at least one of the first object and the second object.

As described above, both the first object and the second object may be independent complete objects.

Alternatively, the first object may be a sub-object obtained by segmenting another object. When the first object has a special shape, if a plurality of layers of bounding boxes are determined for the entire object, space that does not belong to the object may be surrounded. In other words, even the innermost-layer bounding box does not fit the object high enough. In this case, the first object needs to be segmented to improve the degree of fitting between the bounding box and the first object.

In response to a determination that the first object is segmented into a plurality of sub-objects, the apparatus 1001 for determining a plurality of layers of bounding boxes is further configured to: determine a plurality of layers of bounding boxes of each sub-object.

In addition, the collision detection apparatus 1002 is further configured to: perform collision detection layer by layer between the plurality of layers of bounding boxes of each sub-object and the second object in response to determining that a collision occurs between the plurality of layers of bounding boxes of the first object and the second object.

A swim ring is still used as an example for description. When the first object is a swim ring, the plurality of layers of bounding boxes of the first object include a hollow part. In this case, if the first object is not segmented, and collision detection is performed by using the plurality of layers of bounding boxes of the first object, the collision detection apparatus 1002 will generate a detection result indicating occurrence of a collision between the first object and the second object if the second object passes through the hollow part of the swim ring. Obviously, the collision result is incorrect. To avoid this error, when determining that the plurality of layers of bounding boxes of the first object collide with the second object, the collision detection apparatus 1002 performs collision detection layer by layer between the plurality of layers of bounding boxes of each sub-object and the second object. In response to a determination that the second object passes through the hollow part of the swim ring, the collision detection apparatus 1002 determines that no collision occurs between the plurality of layers of bounding boxes of each sub-object and the second object. Therefore, the collision detection apparatus 1002 finally obtains a correct detection result indicating no collision between the first object and the second object.

In addition, in this case, for example, the apparatus 1001 for determining a plurality of layers of bounding boxes may manage the bounding boxes of the entire object and the sub-objects in a form of a bounding box tree. The plurality of layers of bounding boxes for each sub-object and the common bounding box for the plurality of sub-objects form a bounding box tree, where a root node is the maximum common bounding box for all sub-objects, and a leaf node is a bounding box of each sub-object. The collision detection apparatus 1002 successively determines, in a sequence from the root node to the leaf node, whether a corresponding bounding box collides with the bounding box of the second object.

Alternatively, the object may be a combination of a plurality of other objects. Specifically, for a complex scenario with a plurality of objects, the apparatus 1001 for determining a plurality of layers of bounding boxes may also be used for establishing one or more layers of common bounding boxes for a group of objects that are adjacent to each other.

In response to a determination that the first object is included in a group of objects, the apparatus 1001 for determining a plurality of layers of bounding boxes is configured to determine at least one layer of common bounding box of the group of objects.

In addition, the collision detection apparatus 1002 is further configured to: perform collision detection between the at least one layer of common bounding box of the group of objects and the second object; where collision detection between the plurality of layers of bounding boxes of the first object and the second object is performed layer by layer in response to a determination that the at least one layer of common bounding box of the group of objects collides with the second object.

In this way, collision detection efficiency of the collision detection apparatus 1002 can be effectively improved. Specifically, because the common bounding box of the group of objects is generally relatively simple in shape, a calculation amount of performing collision detection is relatively small. If it is determined that no collision occurs between the common bounding box of the group of objects and the second object, the collision detection apparatus 1002 does not need to further determine, based on the plurality of layers of bounding boxes of the first object, whether a collision occurs with the second object, thereby improving collision detection efficiency.

Similarly, the apparatus 1001 for determining a plurality of layers of bounding boxes may manage a common bounding box of a plurality of objects and a bounding box of each object in the form of a bounding box tree. A plurality of layers of bounding boxes for each object and the common bounding box for the plurality of objects form a bounding box tree, where a root node is the maximum common bounding box for all objects, and a leaf node is a bounding box of each object. In this case, the collision detection apparatus 1002 successively determines, in a sequence from the root node to the leaf node corresponding to the first object, whether a corresponding bounding box collides with the bounding box of the second object.

In the object collision detection device according to this embodiment of the present disclosure, collision detection is performed layer by layer based on a plurality of layers of bounding boxes, and a good tradeoff can be reached between collision detection efficiency and accuracy.

As described above, during motion planning and controlling of the robot, it is necessary to determine, according to models and statuses of the robot and the object in the environment, whether the robot will collide unnecessarily with the object in the environment, to generate a reasonable motion and control policy. In addition, accurate collision detection also needs to be performed for a virtual object in a virtual environment. Therefore, the collision detection device based on a plurality of layers of bounding boxes may be applied to a motion control field of a robot or a virtual object.

Specifically, in an implementation, the motion control device includes: an apparatus for determining a plurality of layers of bounding boxes, configured to determine, for at least one of a target object and an obstacle object, a plurality of layers of bounding boxes capable of accommodating the object therein, and a motion path determining apparatus. The motion path determining apparatus is configured to: determine an intermediate location of a first movement based on a start location of the target object, and determine a motion path of the target object at least based on the intermediate location of the first movement. The motion control device further includes a control apparatus, configured to control the target object to move according to the motion path; where the motion path determining apparatus is further configured to determine the intermediate location of the first movement based on the start location of the target object by performing the following processing. A plurality of candidate locations of the first movement are determined based on the start location of the target object, and for each of the plurality of candidate locations according to a layer-by-layer collision detection method based on a plurality of layers of bounding boxes, it is determined whether the target object collides with the obstacle object in response to a determination that the target object is located at the candidate location. A candidate location is selected at which no collision with the obstacle object occurs as the intermediate location of the first movement. The apparatus for determining a plurality of layers of bounding boxes is further configured to determine a polyhedron capable of accommodating the object therein as a first-layer bounding box, and select one vertex from a plurality of vertices of the first-layer bounding box as a target vertex. The apparatus for determining the plurality of layers of bounding boxes is further configured to determine a support plane whose normal vector is a specific direction corresponding to the target vertex, the support plane being a plane passing through a point on a surface of the object and causing the object to be completely located on one side, and cut the current-layer bounding box based on at least the support plane form a smaller bounding box, as a second-layer bounding box. In this embodiment, the current-layer bounding box is the first-layer bounding box.

In addition, in the device according to this embodiment of the present disclosure, the motion path determining apparatus is further configured to select, by performing the following processing, a candidate location at which no collision with the obstacle object occurs as the intermediate location of the first movement: selecting a candidate location closest to a destination location of the target object as the intermediate location of the first movement in response to a determination that there are a plurality of candidate locations at which no collision with the obstacle object occurs, where the motion path determining apparatus is further configured to determine a motion path of the target object at least based on the intermediate location of the first movement by performing the following processing: using a motion path from the start location of the target object to the intermediate location of the first movement as the motion path of the target object.

In addition, in the device according to this embodiment of the present disclosure, the motion path determining apparatus is further configured to select, by performing the following processing, a candidate location at which no collision with the obstacle object occurs as the intermediate location of the first movement: selecting, in response to a determination that there are a plurality of candidate locations at which no collision with the obstacle object occurs, the plurality of candidate locations at which no collision with the obstacle object occurs as intermediate locations of the first movement. In addition, the motion path determining apparatus is further configured to: respectively determine an intermediate location of a second movement based on each intermediate location of the first movement, and determine an intermediate location of a third movement based on the intermediate location of the second movement until a destination location of the target object is reached. The motion path determining apparatus is further configured to determine, by performing the following processing, a motion path of the target object at least based on the intermediate location of the first movement further includes: forming a plurality of motion paths from the start location of the target object to the destination location by connecting intermediate locations of all the movements, and selecting one of the plurality of motion paths as the motion path of the target object based on a predetermined policy.

In addition, in the device according to this embodiment of the present disclosure, the motion path determining apparatus is further configured to: select one of the plurality of motion paths as the motion path of the target object based on a predetermined policy by performing the following processing: selecting, from the plurality of motion paths, one path with the shortest movement distance or requiring the shortest movement time as the motion path of the target object.

Figure 11:
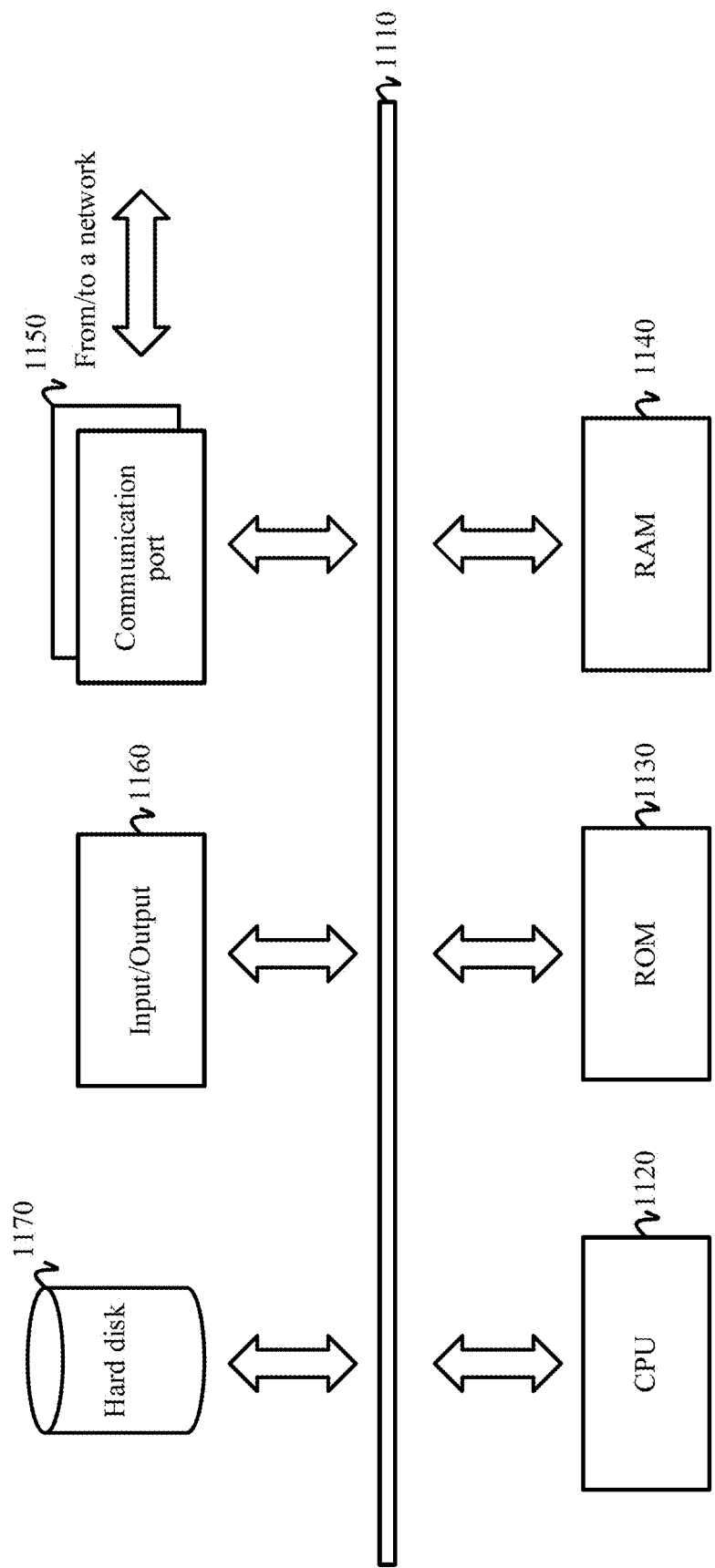
FIG. 11 is a schematic diagram of an architecture of an exemplary computing device according to an embodiment of the present disclosure.

In addition, the method or device according to the embodiments of the present disclosure may alternatively be implemented by using an architecture of a computing device 1100 shown in FIG. 11. As shown in FIG. 11, the computing device 1100 may include a bus 1110, one or more CPUs 1120 (processing circuitry), a read-only memory (ROM) 1130, a random access memory (RAM) 1140, a communication port 1150 connected to a network, an input/output component 1160, a hard disk 1170, and the like. A storage device in the computing device 1100, such as the ROM 1130 or the hard disk 1170 (non-transitory computer-readable storage medium), may store various data or files used in processing and/or communication and program instructions executed by a CPU in the method for determining a plurality of layers of bounding boxes of an object and the object collision detection method provided in the embodiments of the present disclosure. Certainly, the architecture shown in FIG. 11 is only exemplary, and when different devices are implemented, one or more components in the computing device shown in FIG. 11 may be omitted according to an actual need.

The embodiments of the present disclosure may alternatively be implemented as a computer-readable storage medium. Computer-readable instructions are stored on the computer-readable storage medium according to an embodiment of the present disclosure. When the computer readable instructions are run by a processor, the method for determining a plurality of layers of bounding boxes of an object and the object collision detection method described with reference to the foregoing accompanying drawings according to the embodiments of the present disclosure may be performed. The computer-readable storage medium includes, but is not limited to, a volatile memory and/or a non-volatile memory. For example, the volatile memory may include a RAM and/or a cache. For example, the non-volatile memory may include a ROM, a hard disk, or a flash memory.

So far, the method and device for determining a plurality of layers of bounding boxes of an object, the object collision detection method and device, and the computer readable recording medium according to the embodiments of the present disclosure are described in detail with reference to FIG. 1 to FIG. 11. In the method for determining a plurality of layers of bounding boxes of an object according to the embodiments of the present disclosure, a plurality of layers of bounding boxes that become smaller gradually layer by layer and that accommodate the object therein are constructed layer by layer in an outer-to-inner order. Herein, the bounding box is no longer limited to a geometry with a simple shape, but is a complex geometry having a higher degree of fitting with the object. By approximating to an object with a complex shape and a continuous curved surface by using a bounding box, a problem that a related subsequent processing method cannot be applied due to the complex shape of the object can be solved, thereby helping to extend a related algorithm to the object with a complex continuous curved surface. In addition, by constructing a plurality of layers of bounding boxes, different requirements of subsequent processing can be met. In addition, according to the object collision detection method in the embodiments of the present disclosure, collision detection is performed layer by layer based on a plurality of layers of bounding boxes, and a good tradeoff can be reached between collision detection efficiency and accuracy. In addition, in the object collision detection method according to the embodiments of the present disclosure, collision detection accuracy can be effectively improved in a special case by performing collision detection simultaneously based on a plurality of layers of bounding boxes of an object and a plurality of layers of bounding boxes of a plurality of sub-objects obtained through segmentation. In addition, in the object collision detection method according to the embodiments of the present disclosure, for a complex scenario with a plurality of objects, collision detection efficiency can be effectively improved by establishing one or more layers of common bounding boxes for a group of objects that are adjacent to each other.

In this specification, the term "include", "comprise", or any other variant is intended to cover non-exclusive include, so that a process, a method, an article, or a device that includes a series of elements and that not only includes such elements, but also includes other elements not explicitly listed, or may further include elements inherent in the process, the method, the article, or the device. Unless otherwise specified, an element limited by "include . . . " does not exclude other same elements existing in the process, the method, the article, or the device that includes the element.

Finally, the foregoing series of processing not only include processing performed in the order described herein according to a time sequence, but also include processing performed in parallel or separately, rather than according to the time sequence.

Based on the foregoing description of the implementations, a person skilled in the art may clearly understand that the embodiments of the present disclosure may be implemented by using software in addition to a hardware platform, or certainly, may be implemented by using software only. Based on such an understanding, all or the part of the technical solutions of the embodiments of the present disclosure contributing to the technology in the background part may be implemented in the form of a software product. The computer software product may be stored in a storage medium, such as a ROM/RAM, a magnetic disk, or an optical disc, and includes several instructions for instructing a computer device (which may be a personal computer, a server, or a network device) to perform the method described in the embodiments or some parts of the embodiments of the present disclosure.

The embodiments of the present disclosure are described above in detail. Although the principles and implementations of the present disclosure are described by using specific examples in the present disclosure, the descriptions of the foregoing embodiments are merely intended to help understand the method and the core idea of the present disclosure. Meanwhile, a person of ordinary skill in the art may make modifications to the specific implementations and application range according to the idea of the present disclosure. In conclusion, the content of this specification is not construed as a limit on the present disclosure.

What is claimed is:

1. A method for determining a plurality of layers of bounding boxes of an object, the method comprising:
   determining a polyhedron capable of accommodating the object therein as a first-layer bounding box;
   selecting one vertex from a plurality of vertices of the first-layer bounding box as a target vertex;
   determining, by processing circuitry of a computing device, a support plane of the object, the support plane having a normal vector that has a specific direction corresponding to the target vertex and that is closest to the target vertex, the support plane being a plane passing through a point on a surface of the object such that the object is completely located on one side of the support plane; and
   cutting the first-layer bounding box based on at least the support plane to form a smaller bounding box, as a second-layer bounding box.

2. The method according to claim 1, wherein the determining the polyhedron comprises:
   selecting a group of direction vectors;
   respectively determining a plurality of support planes of the object that use each direction vector of the group of direction vectors as a normal vector; and
   using a polyhedron formed by the plurality of support planes as the first-layer bounding box.

3. The method according to claim 1, wherein the selecting comprises:
   determining a shortest distance from each vertex of the plurality of vertices of the first-layer bounding box to the surface of the object;
   selecting a largest one of all the shortest distances as a first distance; and
   using a vertex corresponding to the first distance as the target vertex.

4. The method according to claim 3, wherein the determining the shortest distance comprises:
   respectively performing the following processing for each vertex of the plurality of vertices of the first-layer bounding box:
      determining the specific direction corresponding to a respective vertex of the plurality of vertices of the first-layer bounding box;
      determining the support plane having the normal vector that has the specific direction corresponding to the respective vertex and that is closest to the vertex; and
      calculating a target distance from the respective vertex to the support plane as the shortest distance from the respective vertex to the surface of the object.

5. The method according to claim 1, wherein the determining the support plane comprises:

determining a plurality of planes whose normal vectors are the specific direction corresponding to the target vertex and that pass through different points a point on the surface of the object;

calculating a product of a distance from a coordinate origin to each plane of the plurality of planes and a corresponding coefficient as a distance parameter, the corresponding coefficient being a positive value when a direction of a vertical line from the coordinate origin to the respective plane is the same as the specific direction corresponding to the target vertex, the corresponding coefficient being a negative value when the direction of the vertical line from the coordinate origin to the respective plane is not the same as the specific direction corresponding to the target vertex;

determining a maximum value of the distance parameter; and determining the support plane corresponding to the maximum value of the distance parameter in the plurality of planes.

6. The method according to claim 5, wherein the determining the maximum value of the distance parameter comprises:

performing at least one iteration of segmentation on a value domain of the object to obtain a plurality of subdomains, and respectively determining a plurality of upper bounds of a support function that correspond to the plurality of subdomains, the support function being a function for calculating the maximum value of the distance parameter, and each of the upper bounds of the support function decrease with segmentation on the value domain;

determining a temporary solution of the support function; and selecting, based on the temporary solution of the support function, one of the plurality of upper bounds of the support function as the maximum value of the distance parameter.

7. The method according to claim 6, wherein the temporary solution of the support function is predetermined, and is updated by:

solving, in response to a determination that an upper bound of the support function in one of the plurality of subdomains is greater than the temporary solution of the support function and a size of the one of the plurality of subdomains is less than a first predetermined threshold, the support function in the one of the plurality of subdomains; and updating, in response to a determination that a solved value of the support function is greater than the temporary solution of the support function, the temporary solution of the support function with the solved value of the support function in the one of the plurality of subdomains.

8. The method according to claim 6, wherein the selecting, based on the temporary solution of the support function, the one of the plurality of upper bounds of the support function as the maximum value of the distance parameter comprises:

selecting, from the plurality of upper bounds, an upper bound whose difference from the temporary solution of the support function is greater than 0 and less than a second predetermined threshold as the maximum value of the distance parameter.

9. The method according to claim 1, wherein the object is a sub-object obtained by segmenting another object, or the object is a combination of a plurality of other objects.

10. An object collision detection method, the method comprising:

determining, for at least a first object, a plurality of layers of bounding boxes, each layer of the plurality of layers being capable of accommodating the first object therein;

performing collision detection between at least one of the plurality of layers of bounding boxes of the first object and a second object, to obtain a collision detection result based on the plurality of layers of bounding boxes; and determining, by processing circuitry of a computing device, a collision detection result between the first object and the second object according to the collision detection result based on the plurality of layers of bounding boxes; wherein the determining, for at least the first object, the plurality of layers of bounding boxes capable of accommodating the first object therein comprises:

determining a polyhedron capable of accommodating the first object therein as a first-layer bounding box;

selecting one vertex from a plurality of vertices of the first-layer bounding box as a target vertex;

determining a support plane of the first object, the support plane having a normal vector that has a specific direction corresponding to the target vertex, the support plane being a plane passing through a point on a surface of the first object such that the first object to be completely located on one side of the support plane; and cutting the first-layer bounding box based on at least the support plane to form a smaller bounding box, as a second-layer bounding box.

11. The method according to claim 10, wherein the determining, for at least the first object, the plurality of layers of bounding boxes capable of accommodating the first object therein comprises:

determining, for the second object, a plurality of layers of bounding boxes, each layer of the plurality of layers being capable of accommodating the second object therein; and the performing comprises:

performing collision detection between the plurality of layers of bounding boxes of the first object and at least one of the plurality of layers of bounding boxes of the second object, to obtain the collision detection result.

12. The method according to claim 11, wherein the performing the collision detection between at least one of the plurality of layers of bounding boxes based on the plurality of layers of bounding boxes of the first object and at least one of the plurality of layers of bounding boxes of the second object comprises:

determining, based on the first-layer bounding box of the first object and a first-layer bounding box of the second object, whether a collision occurs between the first-layer bounding box of the first object and the first-layer bounding box of the second object;

determining, in response to a determination that a collision occurs between the first-layer bounding box of the first object and the first-layer bounding box of the second object, whether a target second-layer bounding box that meets a first predetermined condition exists for at least one of the first object or the second object; and further determining, in response to a determination that the target second-layer bounding box that meets the first predetermined condition exists, whether a collision occurs based on the target second-layer bounding box that meets the first predetermined condition.

13. The method according to claim 12, wherein the determining whether the target second-layer bounding box that meets the first predetermined condition exists for at least one of the first object or the second object comprises:
   determining a first point and a second point respectively on the first-layer bounding box of the first object and the first-layer bounding box of the second object, so that the first point and the second point meet a second predetermined condition;
   searching the plurality of layers of bounding boxes of the first object for a first support plane capable of separating the first object from the first point, and searching the plurality of layers of bounding boxes of the second object for a second support plane capable of separating the second object from the second point; and
   determining, in response to a determination that at least one of the first support plane or the second support plane can be found, that the target second-layer bounding box that meets the first predetermined condition exists for at least one of the first object or the second object.

14. The method according to claim 10, wherein, in response to a determination that the first object is segmented into a plurality of sub-objects, the determining the plurality of layers of bounding boxes, each layer of the plurality of layers being capable of accommodating the first object therein comprises:
   determining a plurality of layers of bounding boxes of each sub-object; and
   the performing collision detection between at least one of the plurality of layers of bounding boxes of the first object and a second object comprises:
   performing collision detection between at least one of the plurality of layers of bounding boxes of each sub-object and the second object in response to a determination that a collision occurs between the plurality of layers of bounding boxes of the first object and the second object.

15. The method according to claim 10, wherein in response to a determination that the first object is comprised in a group of objects, the method further comprises:
   determining at least one layer of a common bounding box of the group of objects; and
   before the performing the collision detection between at least one of the plurality of layers of bounding boxes of the first object and a second object, the method further comprises:
      performing collision detection between the at least one layer of the common bounding box of the group of objects and the second object,
   wherein the collision detection between at least one of the plurality of layers of bounding boxes of the first object and the second object is performed in response to a determination that the at least one layer of the common bounding box of the group of objects collides with the second object.

16. A device for determining a plurality of layers of bounding boxes of an object, comprising: processing circuitry configured to
   determine a polyhedron capable of accommodating the object therein as a first-layer bounding box:
   select one vertex from a plurality of vertices of the first-layer bounding box as a target vertex;
   determine a support plane of the object, the support plane having a normal vector that has a specific direction corresponding to the target vertex and that is closest to the target vertex, the support plane being a plane passing through a point on a surface of the object such that the object is completely located on one side of the support plane; and
   cut the first-layer bounding box based on at least the support plane to form a smaller bounding box, as a second-layer bounding box.

17. The device according to claim 16, wherein the processing circuitry is configured to determine the polyhedron by:
   selecting a group of direction vectors:
   respectively determining a plurality of support planes of the object that use each direction vector of the group of direction vectors as a normal vector; and
   using a polyhedron formed by the plurality of support planes as the first-layer bounding box.

18. The device according to claim 16, wherein the processing circuitry is configured to select the target vertex by:
   determining a shortest distance from each vertex of the plurality of vertices of the first-layer bounding box to the surface of the object;
   selecting a largest one of all the shortest distances as a first distance; and
   using a vertex corresponding to the first distance as the target vertex.

19. The device according to claim 18, wherein the processing circuitry is configured to determine the shortest distance by:
   respectively performing the following processing for each vertex of the plurality of vertices of the first-layer bounding box:
      determining the specific direction corresponding to a respective vertex of the plurality of vertices of the first-layer bounding box;
      determining the support plane having the normal vector that has the specific direction corresponding to the respective vertex and that is closest to the vertex; and
      calculating a target distance from the respective vertex to the support plane as the shortest distance from the respective vertex to the surface of the object.

20. The device according to claim 16, wherein the processing circuitry is configured to determine the support plane by:
   determining a plurality of planes whose normal vectors are the specific direction corresponding to the target vertex and that pass through different points on the surface of the object;
   calculating a product of a distance from a coordinate origin to each plane of the plurality of planes and a corresponding coefficient as a distance parameter, the corresponding coefficient being a positive value when a direction of a vertical line from the coordinate origin to the respective plane is the same as the specific direction corresponding to the target vertex, the corresponding coefficient being a negative value when the direction of the vertical line from the coordinate origin to the respective plane is not the same as the specific direction corresponding to the target vertex;
   determining a maximum value of the distance parameter; and
   determining the support plane corresponding to the maximum value of the distance parameter in the plurality of planes.

* * * * *